(12) United States Patent
Hung et al.

(10) Patent No.: US 12,507,426 B2
(45) Date of Patent: Dec. 23, 2025

(54) SEMICONDUCTOR DEVICE AND MANUFACTURING METHOD

(71) Applicant: TAIWAN SEMICONDUCTOR MANUFACTURING COMPANY, LTD., Hsinchu (TW)

(72) Inventors: Chia-Ming Hung, Hsinchu (TW); I-Hsuan Chiu, Hsinchu (TW); Hsiang-Fu Chen, Hsinchu (TW); Kang-Yi Lien, Hsinchu (TW); Chu-Heng Chen, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 489 days.

(21) Appl. No.: 17/840,329

(22) Filed: Jun. 14, 2022

(65) Prior Publication Data

US 2023/0282726 A1 Sep. 7, 2023

Related U.S. Application Data

(60) Provisional application No. 63/316,613, filed on Mar. 4, 2022.

(51) Int. Cl.
*H10D 1/00* (2025.01)
*H10D 64/01* (2025.01)

(52) U.S. Cl.
CPC .......... *H10D 1/045* (2025.01); *H10D 1/025* (2025.01); *H10D 64/035* (2025.01)

(58) Field of Classification Search
CPC .... H10D 30/673; H10D 30/62; H10D 30/689; H10D 30/0323; H10D 30/6713; H10D 30/6744; H10D 30/6757; H10D 62/021; H10D 64/015; H10D 64/021; H10D 30/60; H10D 62/151; H10D 62/364; H10D 64/017; H10D 30/797; H10D 64/671; H10D 84/0193; H10D 84/853; H10D 84/85;
(Continued)

(56) References Cited

U.S. PATENT DOCUMENTS 6,472,942 B1 * 10/2002 Lauffenburger ...... H03F 3/3062
257/E27.047
7,071,052 B2 7/2006 Yeo et al.
(Continued)

FOREIGN PATENT DOCUMENTS

KR 10-2021-0151955 12/2021
KR 10-2022-0016411 2/2022
(Continued)

*Primary Examiner* — Moin M Rahman
(74) *Attorney, Agent, or Firm* — Hauptman Ham, LLP

(57) ABSTRACT

A semiconductor device includes a first substrate having opposite first and second sides, a first conductive layer on the first side of the first substrate, and a second substrate having opposite first and second sides. The second side of the second substrate is bonded to the first side of the first substrate. The second substrate includes a semiconductor material, and at least one circuit element electrically coupled to the first conductive layer. The at least one circuit element includes at least one of a Schottky diode configured by the semiconductor material and a first contact structure, a capacitor having a first electrode of the semiconductor material, or a resistor of the semiconductor material.

20 Claims, 22 Drawing Sheets

(58) Field of Classification Search
CPC ........... H10D 30/6728; H10D 30/6733; H10D 30/6735; H10D 62/118; H10D 89/931; H10D 64/252; H10D 84/0188; H10D 84/201; H10D 18/60; H10D 84/014; H10D 84/0158; H10D 84/0177; H10D 84/038; H10D 84/83; H10D 84/834; H10D 86/215; H10D 30/6215; H10D 30/0217; H10D 30/024; H10D 1/40–476; H10D 89/911; H10D 84/811–817; H10D 84/209; H10D 84/206; H10D 84/942; H10D 1/60–716; H10D 1/66; H10D 1/047; H10D 1/665; H10D 1/045; H10D 1/048; H10D 1/64; H10D 1/025; H10D 64/035; H10D 8/60; H10D 8/051; H10D 1/47; H10D 1/692; H10D 62/85; H10D 87/00; H10D 84/204; H10D 88/00; H01L 21/31116; H01L 21/30604; H01L 21/3065; H01L 21/76224; H01L 21/02068; H01L 21/32134; H01L 21/32136; H01L 21/32137; H01L 21/3213; H01L 21/0228; H01L 2924/1207; H01L 2924/19043; H01L 2924/1205; H01L 2924/19041; H01L 23/481; H01L 25/162; H02K 15/027; A23B 2/783; A45C 11/003; A61K 40/4218; H10F 77/955; H10H 20/826; B82Y 10/00; H10N 70/20–8845; H01G 9/00–28; H01G 4/00–40

See application file for complete search history.

(56) References Cited

U.S. PATENT DOCUMENTS

| | | | |
|---|---|---|---|
| 9,365,416 | B2 | 6/2016 | Shu et al. |
| 9,567,204 | B2 | 2/2017 | Hung et al. |
| 2013/0001746 | A1* | 1/2013 | Edwards ................ H10D 1/716 257/E29.342 |
| 2014/0361865 | A1 | 12/2014 | Tamagawa et al. |
| 2020/0066922 | A1* | 2/2020 | Cheng ................... H10D 1/714 |
| 2020/0091063 | A1* | 3/2020 | Chen ..................... H01L 25/162 |
| 2021/0061647 | A1 | 3/2021 | Chen et al. |
| 2022/0208960 | A1 | 6/2022 | Chen et al. |

FOREIGN PATENT DOCUMENTS

| | | |
|---|---|---|
| TW | 201841336 | 11/2018 |
| TW | 201911525 | 3/2019 |
| WO | 2014069363 | 8/2014 |

\* cited by examiner

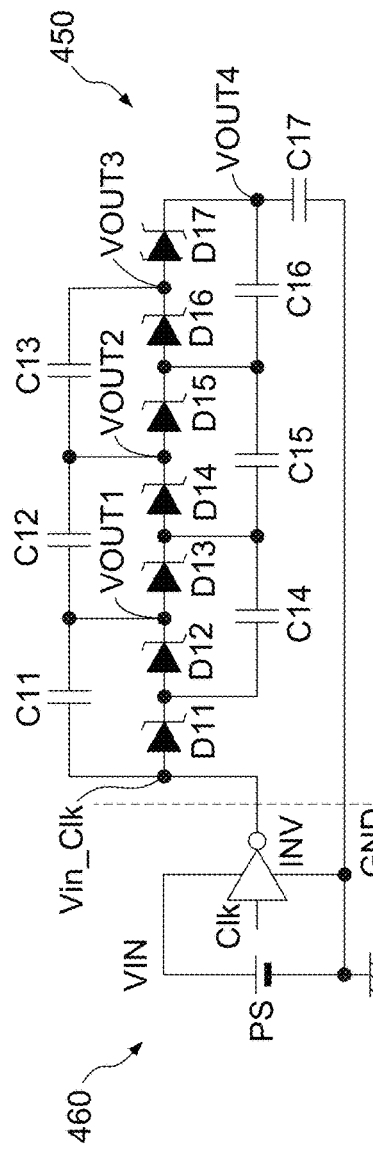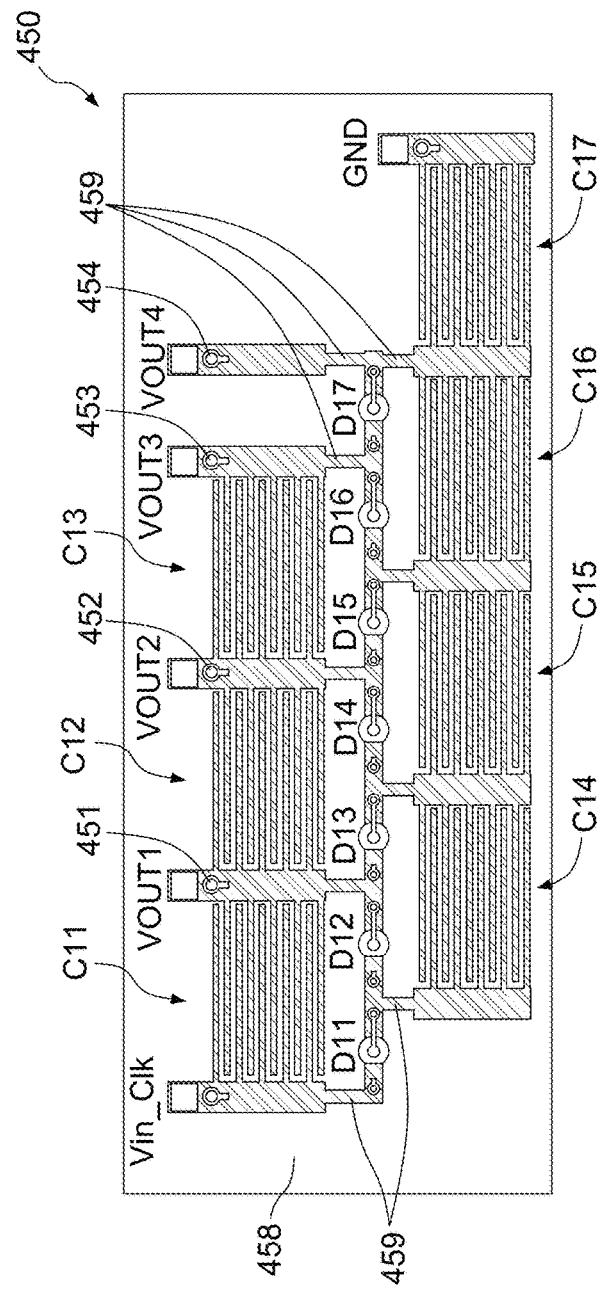

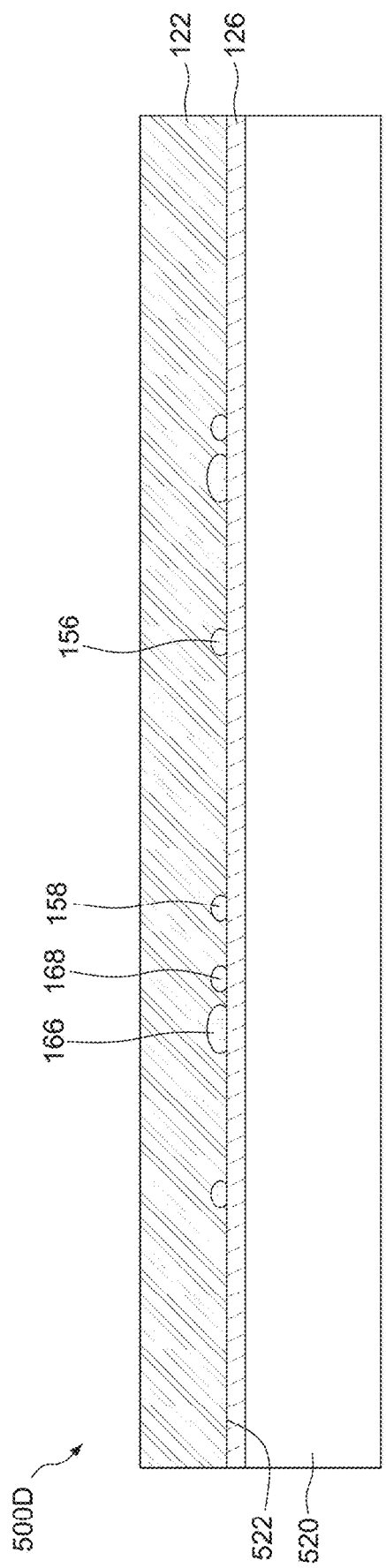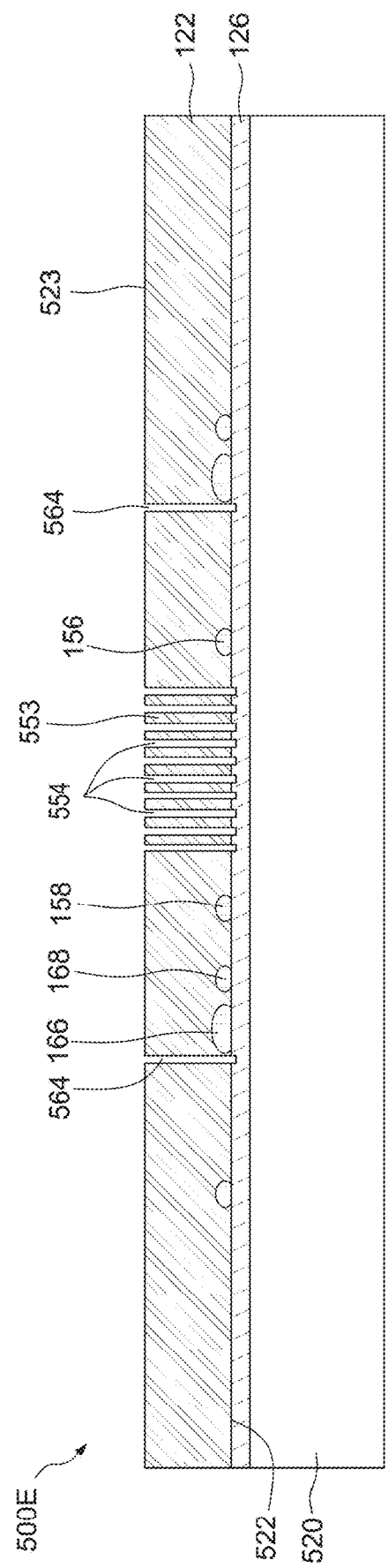

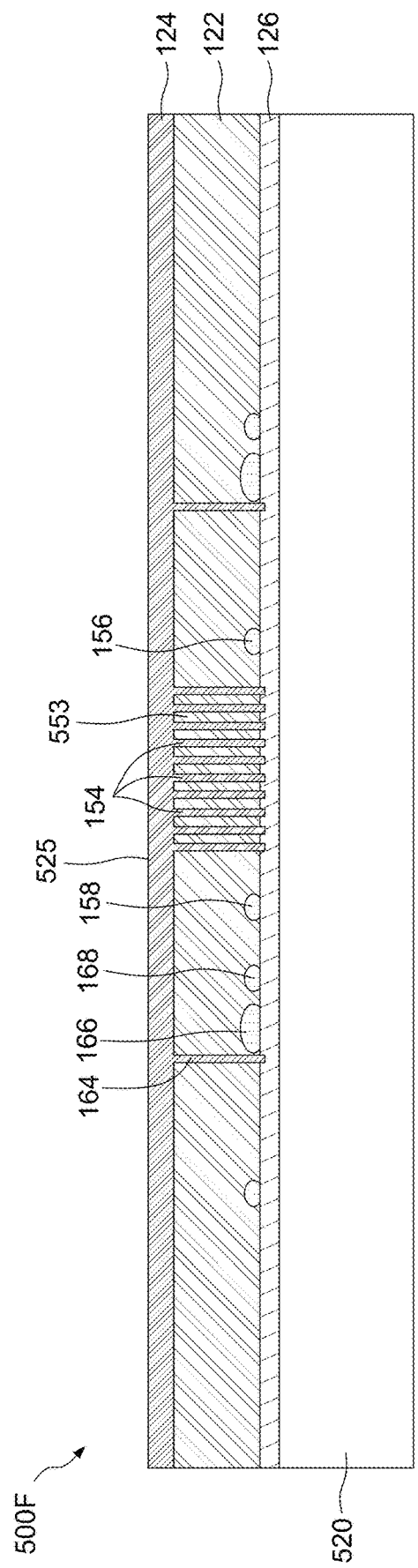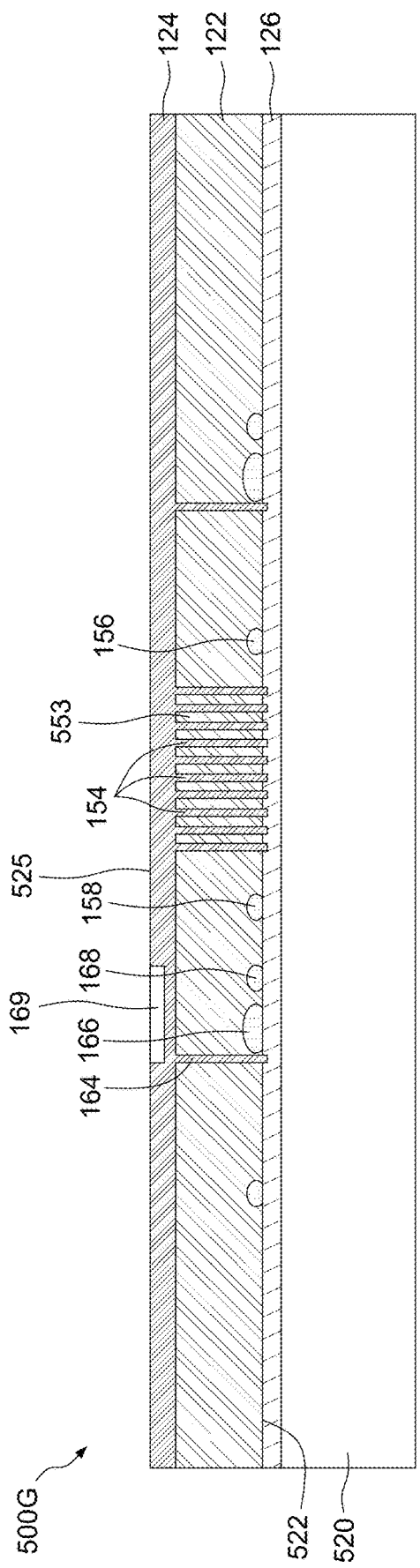

SEMICONDUCTOR DEVICE AND MANUFACTURING METHOD

PRIORITY CLAIM

The instant application claims the benefit of U.S. Provisional Application No. 63/316,613, filed Mar. 4, 2022, which is incorporated by reference herein in its entirety.

BACKGROUND

Semiconductor devices (also referred to as integrated circuit devices, or IC devices) are used in a variety of electronic applications, such as personal computers, cell phones, digital cameras, and other electronic equipment. Semiconductor devices are fabricated by sequentially depositing insulating or dielectric layers, conductive layers, and semiconductor layers of material over a substrate, and patterning the various material layers using lithography to form active circuits and elements thereon. Such active circuits are configured to perform various functions of the semiconductor devices. Semiconductor devices also include passive circuits to support and/or enhance performance and/or functionality of the active circuits. Configurations of passive circuits and/or arrangements of passive circuits relative to the associated active circuits are semiconductor device design and fabrication considerations.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 4C-4D are correspondingly a circuit diagram and a schematic plan view of a charge pump, in accordance with some embodiments.

DETAILED DESCRIPTION

Figure 1:
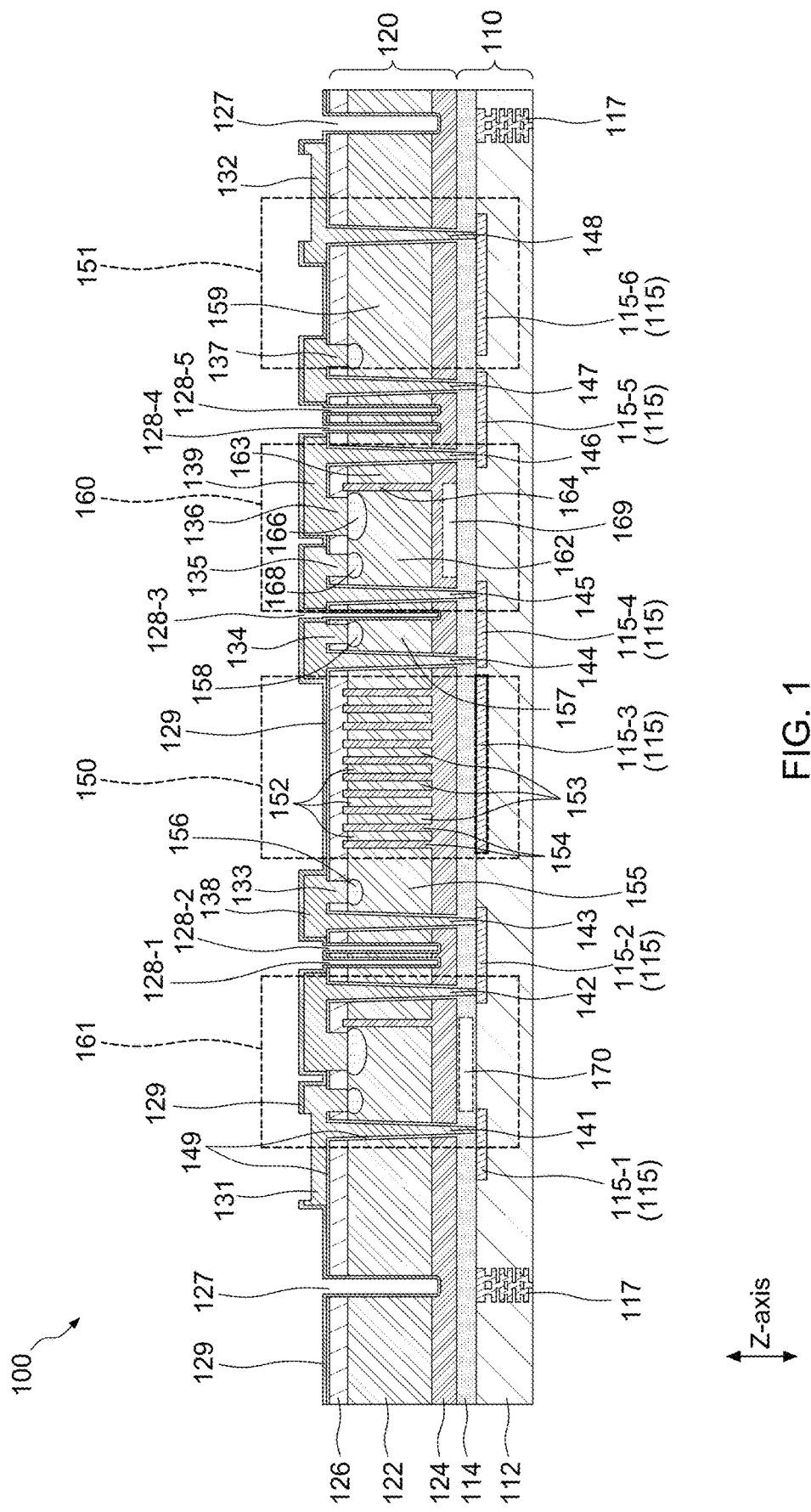
FIG. 1 is a schematic cross-section view of a semiconductor device, in accordance with some embodiments.

The following disclosure provides many different embodiments, or examples, for implementing different features of the provided subject matter. Specific examples of components, materials, values, steps, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In some embodiments, a semiconductor device comprises a first substrate, and a second substrate bonded to the first substrate. In at least one embodiment, the first substrate comprises active circuits. For example, the first substrate is a complementary metal-oxide-semiconductor (CMOS) chip, e.g., a CMOS high performance computing (HPC) chip. The second substrate comprises one or more passive circuits electrically coupled to the active circuits by conductive through vias. The one or more passive circuits comprise circuit elements such as Schottky diodes, capacitors, and resistors, each of which comprises at least a portion of a semiconductor material in the second substrate. In some embodiments, a passive circuit comprises a deep trench capacitor (DTC) or a comb-type capacitor having electrodes made of the semiconductor material of the second substrate. In some embodiments, a passive circuit comprises a Schottky diode formed by a Schottky interface between the semiconductor material of the second substrate and a metal. In some embodiments, a passive circuit comprises a resistor formed by a strip of the semiconductor material in the second substrate. In some embodiments, circuit elements in a passive circuit are electrically coupled to each other by one or more sections of the semiconductor material. In some embodiments, a passive circuit is formed and/or electrically coupled to an active circuit by one or more processes similar to those employed for fabricating micro-electro-mechanical systems (MEMS).

In at least one embodiment, a DTC or a comb-type capacitor is an integrated capacitor other than Metal-Insulator-Metal (MIM) and Metal-Oxide-Metal (MOM) capacitors in other approaches. In at least one embodiment, the integrated capacitor has a higher capacitance (e.g., up to 500 pF level) and a higher breakdown voltage (e.g., greater than 100V) than MIM and MOM capacitors in other approaches. In at least one embodiment, the higher breakdown voltage and higher capacitance of such integrated capacitor make it possible to provide in the second substrate one or more passive circuits for improving performance and/or reliability of the active circuits in the first substrate. Examples of passive circuits include, but are not limited to, a DC power buffer, a pre-signal filter, a voltage clamping circuit, an electrostatic discharge (ESD) circuit, a rectifier, or a charge pump. In at least one embodiment, the formation of one or more Schottky diodes in the second substrate avoids issues related to metal contamination potentially occurring if Schottky diodes are formed in the first substrate in CMOS processes with high process temperatures. In at least one embodiment, circuit elements of passive circuits are formed at a low process temperature (e.g., less than 400° C.), thereby avoiding negative impacts to the active circuits in the first substrate. Further features and/or advantages are within the scopes of various embodiments as described herein.

FIG. 1 is a schematic cross-section view of a semiconductor device 100, in accordance with some embodiments.

The semiconductor device 100 comprises a first substrate 110, and a second substrate 120. Each of the first substrate 110 and the second substrate 120 has opposite first and second sides, and the second side of the second substrate 120 is bonded to the first side of the first substrate 110. For example, the first sides are upper sides and the second sides are lower sides of the first substrate 110 and the second substrate 120 along a thickness direction (Z-axis) of the first substrate 110 and the second substrate 120. The lower side of the second substrate 120 is bonded to the upper side of the first substrate 110.

The first substrate 110 comprises an integrated circuit (IC) structure 112, and a passivation layer 114 over the upper side of the IC structure 112. In some embodiments, the IC structure 112 comprises one or more active circuits configured to perform various functions of the semiconductor device 100. The IC structure 112 further comprises a redistribution structure electrically coupling the active circuits to external circuitry. An example of an IC structure comprising circuit elements forming one or more active circuits and a redistribution structure is described with respect to FIG. 2. In some embodiments, the IC structure 112 comprises active circuits containing CMOS transistors, and is referred to as CMOS substrate. In at least one embodiment, the IC structure 112 comprises a redistribution structure, without active circuits. For example, the IC structure 112 without active circuits is an interposer configured to couple passive circuits in the second substrate 120 to active circuits in another chip bonded to the interposer.

In FIG. 1, a metal layer 115 and a sealing ring 117 of the redistribution structure in the IC structure 112 are illustrated, whereas a remainder of the redistribution structure and any active circuits are omitted for simplicity. The metal layer 115 comprises a plurality of conductive patterns 115-1 to 115-6, and is a top or uppermost metal layer of the redistribution structure. This is an example, and other configurations are within the scopes of various embodiments. In at least one embodiment, one or more of the conductive patterns 115-1 to 115-6 belong to a metal layer other than the top metal layer of the redistribution structure. The metal layer 115 is electrically coupled to one or more circuit elements of one or more passive circuits in the second substrate 120, as described herein. The number and/or arrangement of the conductive patterns 115-1 to 115-6 in FIG. 1 are examples. Other configurations are within the scopes of various embodiments.

In a plan view (not shown) of the IC structure 112, the sealing ring 117 is arranged along a periphery of the IC structure 112 and surrounds a middle or central region of the IC structure 112 where a remainder of the redistribution structure and any active circuits are arranged. The sealing ring 117 has a tower structure in which conductive patterns and via structures in multiple metal layers and via layers of the redistribution structure are stacked and coupled physically and electrically with each other. In at least one embodiment, the sealing ring 117 is electrically coupled to a reference voltage, such as the ground voltage. In at least one embodiment, the sealing ring 117 is electrically floating. The described configuration of the sealing ring 117 is an example. Other sealing ring configurations are within the scopes of various embodiments.

The passivation layer 114 is arranged over the metal layer 115. In at least one embodiment, the passivation layer 114 is configured to bond, e.g., by fusion bonding, the first substrate 110 to the second substrate 120. Example materials of the passivation layer 114 include, but are not limited to, SiN, an oxide such as silicon oxide, SiON, $Al_2O_3$, or the like. In some embodiments, the passivation layer 114 comprises multiple stacks of SiN/$Al_2O_3$. In at least one embodiment, the passivation layer 114 is omitted or replaced with a different material layer, for example, when the first substrate 110 is bonded to the second substrate 120 by a bonding technique other than fusion bonding.

The second substrate 120 comprises a semiconductor layer 122, a lower dielectric layer 124 under the semiconductor layer 122, and an upper dielectric layer 126 over the semiconductor layer 122. The semiconductor layer 122 comprises a semiconductor material. Example semiconductor materials for the semiconductor layer 122 include, but are not limited to, silicon, N-doped silicon, P-doped silicon, GaN, silicon germanium (SiGe), gallium arsenic, or other suitable semiconductor materials. The semiconductor material of the semiconductor layer 122 forms at least partially one or more circuit elements in the second substrate 120, as described herein.

The lower dielectric layer 124 is arranged between the passivation layer 114 and the semiconductor layer 122. In at least one embodiment, the lower dielectric layer 124 is configured, together with the passivation layer 114, to bond the first substrate 110 to the second substrate 120 by fusion bonding. Example materials of the lower dielectric layer 124 include, but are not limited to, SiN, an oxide such as silicon oxide, SiON, $Al_2O_3$, or the like. In at least one embodiment, the lower dielectric layer 124 is omitted or replaced with a different material layer.

The upper dielectric layer 126 is over the semiconductor layer 122. An example material of the upper dielectric layer 126 comprises an oxide. For example, the upper dielectric layer 126 comprises a thermal oxide formed during the manufacture of a silicon on insulator (SOI) substrate. Other materials of the upper dielectric layer 126 are within the scopes of various embodiments. In at least one embodiment, the upper dielectric layer 126 is omitted.

A sealing trench 127 is formed in the second substrate 120. In the example configuration in FIG. 1, the sealing trench 127 is etched into the second substrate 120 to extend, downwardly along the thickness direction, through the upper dielectric layer 126 and the semiconductor layer 122, into at least a partial thickness of the lower dielectric layer 124. In a plan view (not shown) of the second substrate 120, the sealing trench 127 is arranged along a periphery of the second substrate 120 and surrounds a middle or central region of the second substrate 120 where one or more passive circuits are arranged. In the example configuration in FIG. 1, the sealing trench 127 in the second substrate 120 is aligned, along the thickness direction, with the sealing ring 117 in the IC structure 112. Other sealing ring configurations are within the scopes of various embodiments.

One or more isolation trenches 128-1 to 128-5 are formed in the second substrate 120 to isolate adjacent circuit elements of the second substrate 120 from each other, and/or to define routing and/or pads on the second substrate 120. The isolation trenches 128-1 to 128-5 are etched into the second substrate 120 to extend, downwardly along the thickness direction, through the upper dielectric layer 126 and the semiconductor layer 122, into at least a partial thickness of the lower dielectric layer 124. The isolation trenches 128-1 are narrower than the sealing trench 127. The number and/or arrangement of the isolation trenches 128-1 to 128-5 in FIG. 1 are examples. Other configurations are within the scopes of various embodiments.

A passivation layer 129 is deposited over the second substrate 120, and lines sidewalls and bottoms of the sealing trench 127 and isolation trenches 128-1 to 128-5. In the example configuration in FIG. 1, the passivation layer 129 lines the sidewalls and bottom of the sealing trench 127, but leaves a remainder of the sealing trench 127 unfilled. In at least one embodiment, the sealing trench 127 is filled by the passivation layer 129 and/or by a further dielectric layer. In the example configuration in FIG. 1, the passivation layer 129 lines the sidewalls and bottoms of the isolation trenches 128-1 to 128-5, and also fills the isolation trenches 128-1 to 128-5. In at least one embodiment, one or more of the isolation trenches 128-1 to 128-5 are left unfilled, or are filled by a further dielectric layer. Example materials of the passivation layer 129 include, but are not limited to, SiN, an oxide such as silicon oxide, SiON, or the like.

Conductive features are formed in or over the second substrate 120. In the example configuration in FIG. 1, the conductive features comprise contact pads 131, 132, contact structures 133-137, connectors 138-139, and conductive through vias 141-148. The contact pads 131, 132, contact structures 133-137, and connectors 138-139 are sometimes collectively referred to as metal routing. The metal routing is configured to electrically couple circuits in the first substrate 110 and circuits in the second substrate 120 by ways of the conductive through vias 141-148, and/or provide routing for various circuit elements on the second substrate 120, and/or form input/output (IO) pads on top of the second substrate 120 for external connections and/or mounting. Examples of external connections and/or mounting technology include, but are not limited to, wire bonding, bumps, Integrated Fan-Out (InFO), Wafer-Level Chip-Scale Packaging (WLCSP), chip-on-wafer-on-substrate (CoWoS), or the like. In at least one embodiment, contact pads 131, 132 on the second substrate, e.g., a Si substrate, offer a stress buffer to bumps for external connections and/or mounting. For simplicity, not all conductive features are numbered in FIG. 1. Further, the number and/or arrangements of conductive features and/or electrical connections to/from the conductive features in FIG. 1 are examples. Other configurations are within the scopes of various embodiments. Example materials of the conductive features include, but are not limited to, Ti, TiN, AlCu, Ag, Au, or the like. In some embodiments, some conductive features comprise different conductive materials.

The contact pads 131, 132 and the connectors 138-139 are over the upper dielectric layer 126, and the contact structures 133-137 are embedded in the upper dielectric layer 126. Each of the contact structures 133-137 has a lower part in physical and electrical contact with a portion of the semiconductor layer 122, and an upper portion in physical and electrical contact with a connector or a contact pad. The conductive through vias 141-148 extend through the upper dielectric layer 126, the semiconductor layer 122 and the lower dielectric layer 124, to come into physical and electrical contact with corresponding conductive patterns in the metal layer 115 of the redistribution structure in the IC structure 112. The connectors 138-139 electrically couple the contact pads 131, 132, contact structures 133-137 and conductive through vias 141-148 with each other. As a result, active circuits in the IC structure 112 or in another chip, are electrically coupled through the redistribution structure of the IC structure 112, the conductive through vias 141-148, the connectors 138-139 and the contact structures 133-137 to circuit elements in one or more passive circuits in the second substrate 120.

The passivation layer 129 is over and covers the connectors 138-139, while leaving the contact pads 131, 132 exposed for electrical connection with other circuitry of the semiconductor device 100 and/or with external circuitry. In some embodiments, the semiconductor device 100 further comprises one or more additional metal layers and dielectric layers over the contact pads 131, 132 for routing to other circuitry of the semiconductor device 100 and/or external circuitry outside the semiconductor device 100.

In the example configuration in FIG. 1, the conductive through vias 141-148 are electrically isolated from the semiconductor layer 122 by a dielectric layer 149 lining sidewalls of the conductive through vias 141-148. In at least one embodiment, one or more of the conductive through vias 141-148 are not electrically isolated from the semiconductor layer 122, e.g., the dielectric layer 149 or another dielectric lining is omitted on the sidewalls of one or more of conductive through vias 141-148. In at least one embodiment, the dielectric layer 149 exists between the upper dielectric layer 126 and at least one of the passivation layer 129, a contact pad among the contact pads 131, 132, or a connector among the connectors 138-139. An example material of the dielectric layer 149 comprises an oxide, such as silicon oxide. Other dielectric materials are within the scopes of various embodiments.

The second substrate 120 comprises one or more circuit elements which configure one or more passive circuits and are electrically coupled to the metal layer 115 of the redistribution structure in the IC structure 112. In at least one embodiment, the second substrate 120 comprises at least one circuit element electrically coupled to the metal layer 115, and the at least one circuit element comprises at least one of a Schottky diode configured by the semiconductor material and a contact structure, a capacitor having at least one electrode of the semiconductor material, or a resistor of the semiconductor material. In the example configuration in FIG. 1, the circuit elements of the second substrate 120 comprise capacitors 150, 151, and Schottky diodes 160, 161. The number and/or types of circuit elements and/or electrical connections of the circuit elements in FIG. 1 are example. Other configurations are within the scopes of various embodiments.

The capacitor 150 is a comb-type capacitor, i.e., a capacitor having a comb structure, and comprises a plurality of fingers of the semiconductor material of the semiconductor layer 122. The plurality of fingers comprises first fingers 152 configuring a first electrode of the capacitor 150, and second fingers 153 configuring a second electrode of the capacitor 150. The first fingers 152 and the second fingers 153 are interdigitated with each other. Interposing portions 154 of a dielectric material are arranged between adjacent first fingers 152 and second fingers 153. The interposing portions 154 configure the dielectric between the first electrode and the second electrode of the capacitor 150. In the example configuration in FIG. 1, the interposing portions 154 comprise the dielectric material of the lower dielectric layer 124, and extend from the lower dielectric layer 124, upwardly along the thickness direction, through the semiconductor layer 122 and into at least a partial thickness of the upper dielectric layer 126. Other configurations of the interposing portions 154 are within the scopes of various embodiments.

A conductive pattern 115-3 of the metal layer 115 of the IC structure 112 overlaps the first fingers 152 and second fingers 153 of the capacitor 150 along the thickness direction. The conductive pattern 115-3 is configured as a shielding for the capacitor 150 against interference, noises and/or crosstalk from the IC structure 112. In at least one embodiment, the conductive pattern 115-3 is electrically coupled to a reference voltage, such as a power supply voltage or the ground voltage. In at least one embodiment, the conductive pattern 115-3 is electrically floating. In at least one embodiment, the conductive pattern 115-3 is omitted.

The first fingers 152 configuring the first electrode of the capacitor 150 are continuous with a portion 155 of the semiconductor layer 122. The portion 155 of the semiconductor layer 122 comprises a doped region 156 which is in ohmic contact with the contact structure 133. The connector 138 electrically couples the contact structure 133 to the conductive through via 143 which is electrically coupled to the conductive pattern 115-2 in the metal layer 115 of the IC structure 112. As a result, the first electrode of the capacitor 150 is electrically coupled to the IC structure 112. The ohmic contact is achievable by appropriately selecting the conductive material (e.g., a metal) of the contact structure 133 and/or controlling doping of the doped region 156. For example, the doped region 156 contains boron (B) or phosphorus (P) dopants at a concentration different from a remainder of the portion 155 of the semiconductor layer 122. In some embodiments, the doped region 156 is omitted.

The second fingers 153 configuring the second electrode of the capacitor 150 are continuous with a portion 157 of the semiconductor layer 122. The portion 157 of the semiconductor layer 122 comprises a doped region 158 which is in ohmic contact with the contact structure 134. A connector (not numbered) electrically couples the contact structure 134 to the conductive through via 144 which is electrically coupled to the conductive pattern 115-4 in the metal layer 115 of the IC structure 112. As a result, the second electrode of the capacitor 150 is electrically coupled to the IC structure 112. The ohmic contact is achievable by appropriately selecting the conductive material (e.g., a metal) of the contact structure 134 and/or controlling doping of the doped region 158, for example, as described with respect to the doped region 156. In some embodiments, the doped region 158 is omitted. In at least one embodiment, at least one of the described connections from the capacitor 150 to the IC structure 112 is omitted. In the example configuration in FIG. 1, the capacitor 150 is electrically isolated from adjacent circuit elements in the second substrate 120 by isolation trenches 128-2, 128-3. In at least one embodiment, at least one of the isolation trenches 128-2, 128-3 is omitted. Further details of an example comb-type capacitor is described with respect to FIGS. 3A-3C.

In at least one embodiment, a resistor in the second substrate 120 has a cross-section similar to the cross-section of the capacitor 150 in FIG. 1. A difference is that, in such resistor, first fingers (corresponding to the first fingers 152 in FIG. 1) and second fingers (corresponding to the second fingers 153 in FIG. 1) are continuous to each other to form a continuous strip of the semiconductor material of the semiconductor layer 122. The continuous strip of the semiconductor material configures the resistor. In at least one embodiment, a shielding conductive pattern corresponding to the conductive pattern 115-3 is omitted under a resistor in the second substrate 120. Further details of an example resistor is described with respect to FIG. 3D.

The capacitor 151 is a flat-type capacitor. A first electrode of the capacitor 151 comprises a portion 159 of the semiconductor layer 122. A second electrode of the capacitor 151 comprises the conductive pattern 115-6 of the IC structure 112. A dielectric of the capacitor 151 comprises portions of the passivation layer 114 and lower dielectric layer 124 between the portion 159 of the semiconductor layer 122 and the conductive pattern 115-6. The portion 159 of the semiconductor layer 122 configuring the first electrode of the capacitor 151 is electrically coupled to the contact structure 137 through a doped region (not numbered) similar to the doped region 156. In at least one embodiment, the doped region is omitted. The contact structure 137 is electrically coupled to the conductive pattern 115-5 of the IC structure 112 by the conductive through via 147. The conductive pattern 115-6 configuring the second electrode of the capacitor 151 is electrically coupled to the contact pad 132 by the conductive through via 148. In the example configuration in FIG. 1, the capacitor 151 is electrically isolated from adjacent circuit elements in the second substrate 120 by the isolation trenches 128-5. In at least one embodiment, the isolation trench 128-5 is omitted.

The Schottky diode 160 is configured by the contact structure 136 and a portion 162 of the semiconductor layer 122 in contact with the contact structure 136. The portion 162 of the semiconductor layer 122 is electrically isolated from an adjacent portion 163 of the semiconductor layer 122 by an isolation trench 164 including a dielectric material. In the example configuration in FIG. 1, the isolation trench 164 comprises the dielectric material of the lower dielectric layer 124, and extends from the lower dielectric layer 124, upwardly along the thickness direction, through the semiconductor layer 122 and into at least a partial thickness of the upper dielectric layer 126. Other configurations of the isolation trench 164 are within the scopes of various embodiments.

The portion 162 of the semiconductor layer 122 comprises a doped region 166 in Schottky contact with the contact structure 136. The contact structure 136 is electrically coupled to the conductive through via 146 by the connector 139 which extends across the isolation trench 164. The conductive through via 146 is electrically coupled to the conductive pattern 115-5 of the IC structure 112. As a result, a first terminal (e.g., an anode or a cathode) of the Schottky diode 160 is electrically coupled to the IC structure 112. The Schottky contact between the doped region 166 and the contact structure 136 is achievable by appropriately selecting the conductive material (e.g., a metal) of the contact structure 136 and/or controlling doping of the doped region 166. For example, the doped region 166 contains boron (B) or phosphorus (P) dopants at a concentration different from a remainder of the portion 162 of the semiconductor layer 122. In some embodiments, the doped region 166 is omitted.

The portion 162 of the semiconductor layer 122 further comprises a doped region 168 in ohmic contact with the contact structure 135. A connector (not numbered) electrically couples the contact structure 135 to the conductive through via 145 which is electrically coupled to the conductive pattern 115-4 in the metal layer 115 of the IC structure 112. As a result, a second terminal (e.g., a cathode or an anode) of the Schottky diode 160 is electrically coupled to the IC structure 112. The ohmic contact between the doped region 168 and the contact structure 135 is achievable in a manner as described with respect to the ohmic contact between the doped region 156 and the contact structure 133. In some embodiments, the doped region 168 is omitted. In at least one embodiment, the dopants and/or doping concentrations in the doped region 166 and the doped region 168 are different from each other. In at least one embodiment, at least one of the described connections from the Schottky diode 160 to the IC structure 112 is omitted. In the example configuration in FIG. 1, the Schottky diode 160 is electrically isolated from adjacent circuit elements in the second substrate 120 by isolation trenches 128-3, 128-4. In at least one embodiment, at least one of the isolation trenches 128-3, 128-4 is omitted.

A buried cavity 169 is formed in the lower dielectric layer 124, and overlaps at least the Schottky contact between the doped region 166 and the contact structure 136 along the thickness direction. In the example configuration in FIG. 1, the buried cavity 169 overlaps both the doped region 166 and the doped region 168 along the thickness direction. In some embodiments, the buried cavity 169 contains vacuum, air or a gas. In some embodiments, one or more buried cavities 169 is/are formed in one or more of the semiconductor layer 122, the lower dielectric layer 124, and the passivation layer 114. In some embodiments, the passivation layer 114 and/or the lower dielectric layer 124 is/are fully or partial etched to form one or more buried cavities 169. Example shapes of each buried cavity 169 include, but are not limited to, circle, square, or any other shapes. The buried cavity 169 is configured to thermally shield or dissipate heat generated by the IC structure 112 during operation. As a result, in one or more embodiments, negative effects that the heat generated by the IC structure 112 during operation may have on the Schottky diode 160, which is a thermally sensitive circuit element, is eliminated or at least reduced. In some embodiments, the buried cavity 169 is omitted.

The Schottky diode 161 is configured similarly to the Schottky diode 160, except that a buried cavity 170 corresponding to the buried cavity 169 is formed in the passivation layer 114. In some embodiments, one or more buried cavities 170 is/are formed in one or more of the semiconductor layer 122, the lower dielectric layer 124, and the passivation layer 114. In at least one embodiment, the buried cavity 170 is omitted. Further details of an example Schottky diode is described with respect to FIGS. 3E-3F.

In FIG. 1, various features are not drawn to scale. For example, the second substrate 120 is thinner than the first substrate 110 in one or more embodiments. Unless otherwise specified, thicknesses of various features and/or layers described herein are along the Z-axis. In some embodiments, the thickness of the first substrate 110 is at least 400 μm. For example, the thickness of the first substrate 110 is 400, 500, 725, 771, or 775 μm. The thickness of the passivation layer 114 is from 1000 Å (0.1 μm) to 300000 Å (30 μm). The thickness of the lower dielectric layer 124 is from 0 Å (the lower dielectric layer 124 is omitted) to 10000 Å (1 μm). The thickness of the semiconductor layer 122 is from 1000 Å (0.1 μm) to 500000 Å (50 μm). The thickness of the upper dielectric layer 126 is from 100 Å (0.01 μm) to 100000 Å (10 μm). The thickness of the metal layer, such as contact pads and connectors over the upper dielectric layer 126, is from 500 Å (0.05 μm) to 30000 Å (3 μm). Additional metal layers have similar thicknesses. The thickness of the passivation layer 129 is from 500 Å (0.05 μm) to 20000 Å (2 μm). Additional passivation layers have similar thicknesses. The thickness of the buried cavity 169 is from 500 Å (0.05 μm) to 500000 Å (50 μm). The thickness of a doped layer including various doped regions 156, 158, 166, 168 is from 0 Å (the doped regions are omitted) to 500000 Å (50 μm). In an example shown in FIG. 3F, this thickness of the doped layer is designated as d3. The described configurations of the semiconductor device 100 are examples. Other configurations are within the scopes of various embodiments.

Figure 2:
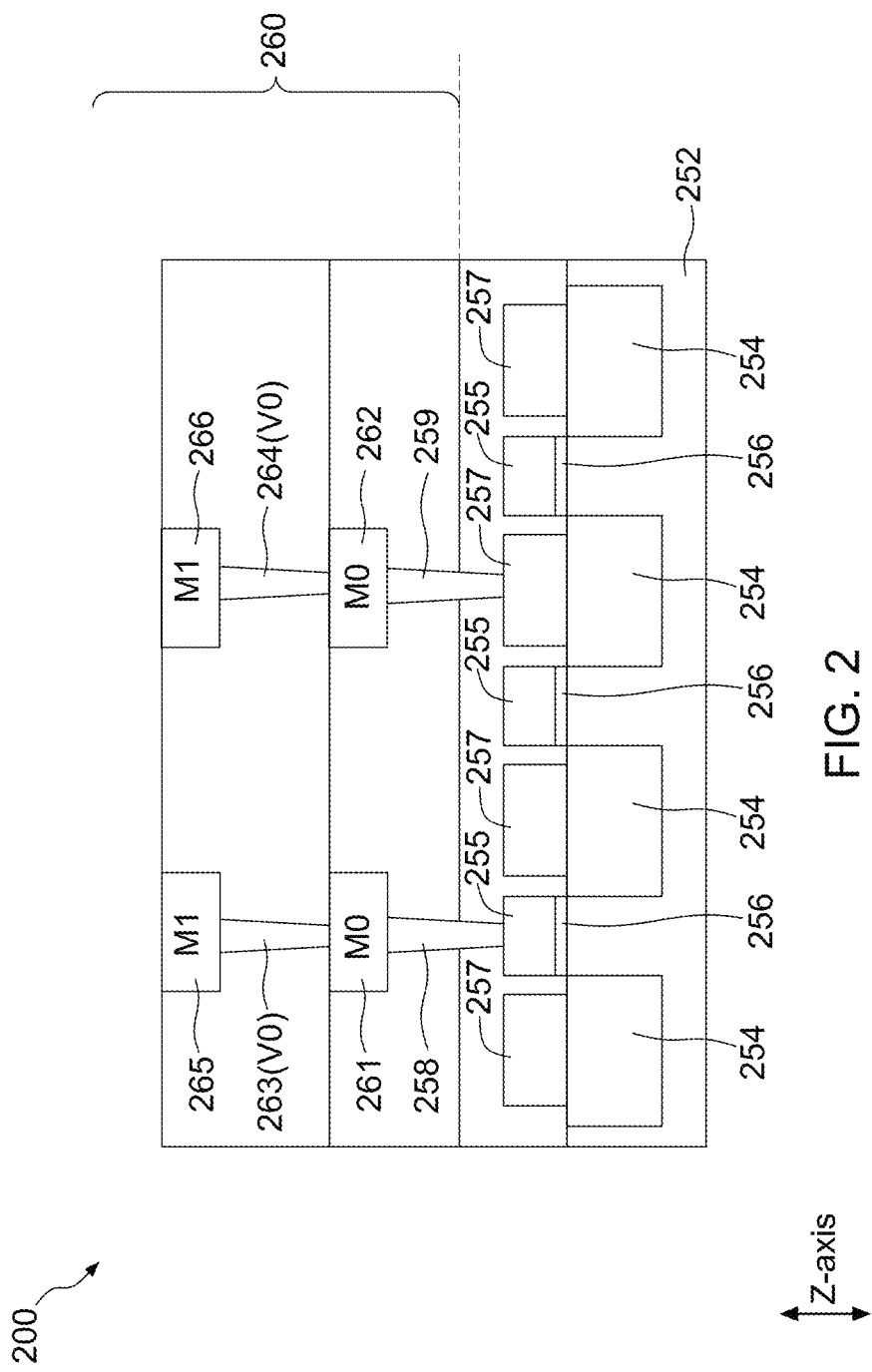
FIG. 2 is a schematic cross-section view of a portion of a semiconductor device, in accordance with some embodiments.

FIG. 2 is a schematic cross-section view of a portion of a semiconductor device 200, in accordance with some embodiments. In some embodiments, the semiconductor device 200 corresponds to the IC structure 112 in FIG. 1.

In some embodiments, the semiconductor device 200 comprises one or more active circuits. Example active circuits include, but are not limited to, inverters, adders, multipliers, logic gates, phase lock loops (PLLs), flip-flops, multiplexers, memory cells, or the like. Example logic gates include, but are not limited to, includes an AND, OR, NAND, NOR, XOR, INV, AND-OR-Invert (AOI), OR-AND-Invert (OAI), MUX, Flip-flop, BUFF, Latch, delay, clock cells, or the like. In some embodiments, circuit elements forming active circuits include, but are not limited to, transistors and diodes. Examples of transistors include, but are not limited to, metal oxide semiconductor field effect transistors (MOSFET), complementary metal oxide semiconductor (CMOS) transistors, bipolar junction transistors (BJT), high voltage transistors, high frequency transistors, p-channel and/or n-channel field effect transistors (PFETs/NFETs), FinFETs, planar MOS transistors with raised source/drain, or the like. In at least one embodiment, one or more active circuits comprise further circuit elements including, but are not limited to, capacitors, inductors, fuses, resistors, or the like. In some embodiments, the active circuits are electrically coupled to perform various functions of the semiconductor device 200. As a result, the semiconductor device 200 is configured as one or more of memories, memory control logics, communications interfaces, application programming interfaces (APIs), analog to digital (A/D) converters, radio frequency tuners, digital signal processors (DSPs), graphics processing units (GPUs), arithmetic logic units (ALUs), floating-point units (FPUs), central processing units (CPUs), or the like.

As shown in FIG. 2, the semiconductor device 200 comprises a substrate 252 over which circuit elements and interconnecting structures are formed. The substrate 252 comprises, in at least one embodiment, silicon, silicon germanium (SiGe), gallium arsenic, or other suitable semiconductor or dielectric materials. In some embodiments, the substrate 252 is a P-doped substrate. In some embodiments, the substrate 252 is an N-doped substrate. In some embodiments, the substrate 252 is a rigid crystalline material other than a semiconductor material (e.g., diamond, sapphire, aluminum oxide ($Al_2O_3$), or the like) on which an IC is manufactured.

The semiconductor device 200 further comprises N-type and/or P-type dopants added to the substrate 252 to correspondingly form n-channel metal-oxide semiconductor (NMOS) active regions and/or p-channel metal-oxide semiconductor (PMOS) active regions. The NMOS active regions and PMOS active regions form active regions in which sources/drains 254 of various transistors in the active circuits of the semiconductor device 200 are formed. Source/drain(s) may refer to a source or a drain, individually or collectively dependent upon the context. In some embodiments, isolation structures are formed between adjacent active regions. For simplicity, isolation structures are omitted from FIG. 2.

The semiconductor device 200 further comprises various gate structures over the active regions. For example, a gate structure comprises a gate electrode 255 of a transistor, and a corresponding gate dielectric 256 over an active region of the substrate 252. Example materials of the gate dielectric 256, which includes one or more layers, include HfO2, ZrO2, or the like. Example materials of the gate electrode 255 include polysilicon, metal, or the like. In at least one embodiment, one or more gate structures are dummy gates and include dielectric materials.

The semiconductor device 200 further comprises contact structures 257 over sources/drains of various transistors for electrically coupling the underlying sources/drains of the transistors to other circuit elements. Example materials of the contact structures 257 include one or more metals.

The semiconductor device 200 further comprises via-to-device (VD) vias and via-to-gate (VG) vias correspondingly over and in electrical contact with contact structures and gate structures. For example, as shown in FIG. 2, a VG via 258 is over and in electrical contact with the gate electrode 255 of one of the gate structures, and a VD via 259 is over and in electrical contact with one of the contact structures 257. Example materials of the VD and VG vias include one or more metals.

The semiconductor device 200 further comprises a redistribution structure 260 which is over the VD and VG vias, and comprises a plurality of metal layers and via layers sequentially and alternatingly arranged over the VD and VG vias. The lowermost metal layer immediately over and in electrical contact with the VD and VG vias is a metal-zero (M0) layer. A next metal layer immediately over the M0 layer is a metal-one (M1) layer, or the like. A via layer Vn is arranged between and electrically couple the Mn layer and the Mn+1 layer, where n is an integer form zero and up. For example, a via-zero (V0) layer is the lowermost via layer which is arranged between and electrically couple the M0 layer and the M1 layer. Other via layers are V1, V2, or the like. The redistribution structure 260 further comprises various interlayer dielectric (ILD) layers (not shown or numbered) in which the metal layers and via layers are embedded. The metal layers and via layers of the redistribution structure 260 are configured to electrically couple various elements or circuits of the semiconductor device 200 with each other, and/or with external circuitry. In the example configuration in FIG. 2, the M0 layer comprises M0 conductive patterns 261, 262 correspondingly over and in electrical contact with the VG via 258 and VD via 259, the V0 layer comprises V0 vias 263, 264 correspondingly over and in electrical contact with the M0 conductive patterns 261, 262, the M1 layer comprises M1 conductive patterns 265, 266 correspondingly over and in electrical contact with the V0 vias 263, 264. For simplicity, metal layers and via layers above the M1 layer are omitted in FIG. 2. In some embodiments, the redistribution structure 260 corresponds to the redistribution structure in the IC structure 112 described with respect to FIG. 1. For example, a top metal layer (not shown) of the redistribution structure 260 corresponds to the metal layer 115.

Figure 3A:
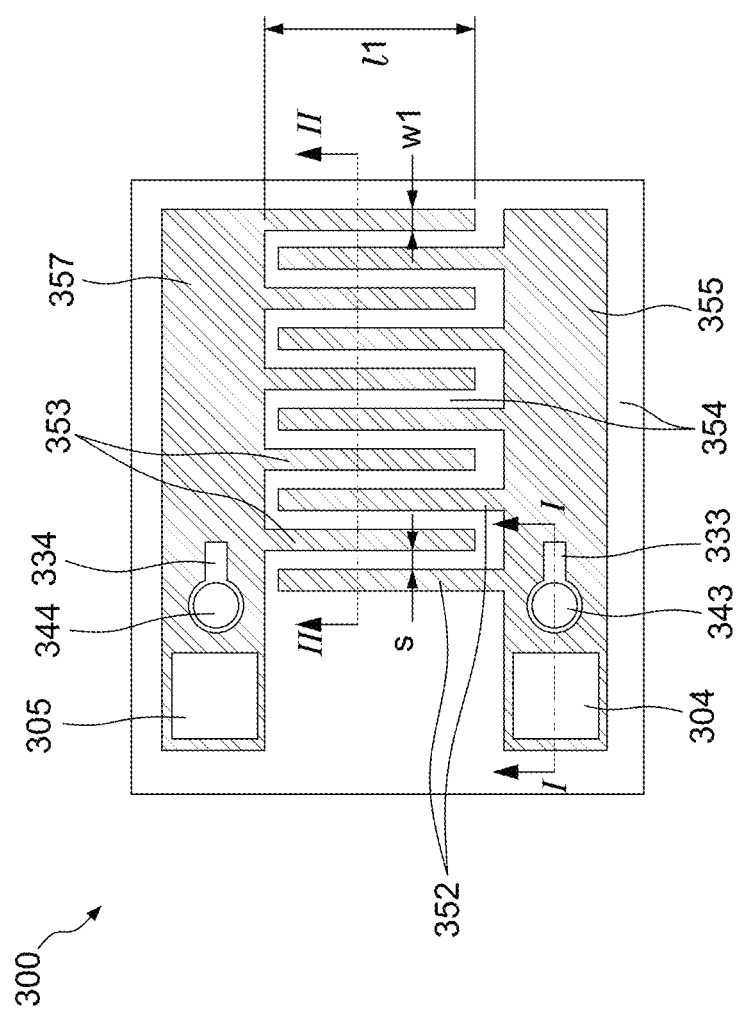
FIGS. 3A-3C are correspondingly a schematic plan view, a schematic cross-section view and a schematic perspective view of a capacitor in a semiconductor device, in accordance with some embodiments.
Figure 3B:
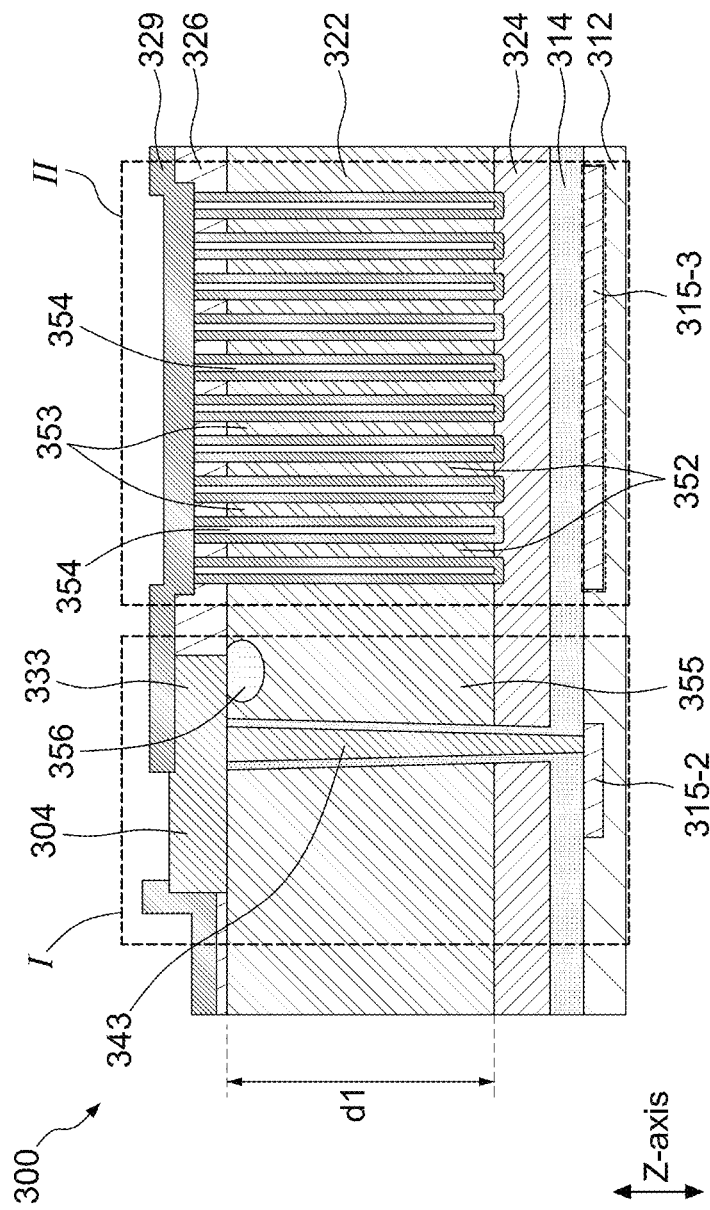
Figure 3D:
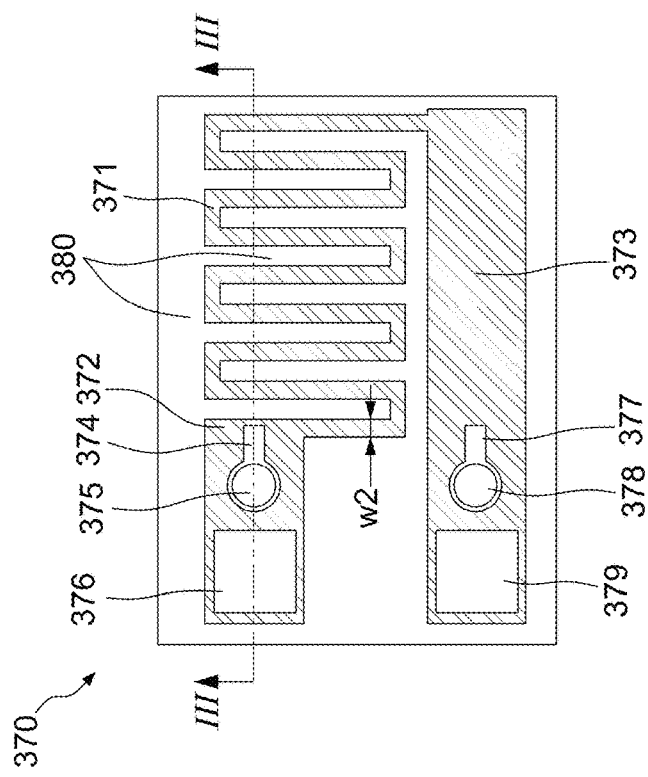
FIG. 3D is a schematic plan view of a resistor in a semiconductor device, in accordance with some embodiments.
Figure 3C:
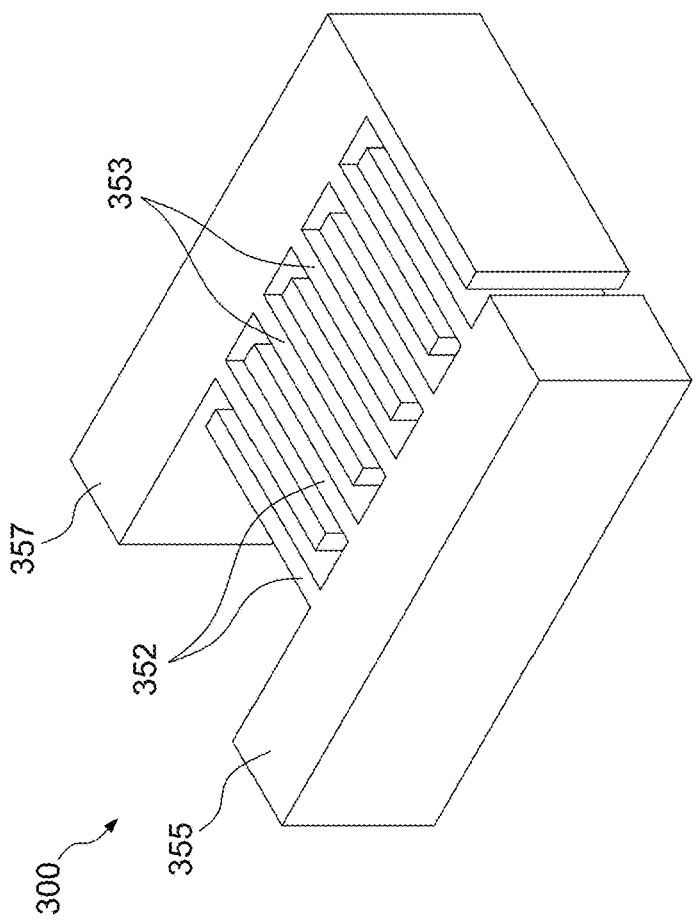

FIGS. 3A-3C are correspondingly a schematic plan view, a schematic cross-section view and a schematic perspective view of a capacitor 300 in a semiconductor device, in accordance with some embodiments. Regions I and II in FIG. 3B are correspondingly cross-sections taken along lines I-I and II-II in FIG. 3A. In some embodiments, the capacitor 300 corresponds to the capacitor 150 in a second substrate containing passive circuits. Components in FIGS. 3A-3C having corresponding components in FIG. 1 are designated by the reference numerals of FIG. 1 increased by two hundred.

In FIG. 3A, the capacitor 300 comprises a plurality of fingers of a semiconductor material of a semiconductor layer 322 (FIG. 3B). The plurality of fingers comprises first fingers 352 configuring a first electrode of the capacitor 300, and second fingers 353 configuring a second electrode of the capacitor 300. The first fingers 352 and the second fingers 353 are interdigitated with each other. The illustrated number of fingers 352, 353 in the capacitor 300 is an example. Other finger numbers are within the scopes of various embodiments. In at least one embodiment, the capacitor 300 comprises at least one first finger 352 and at least one second finger 353. Portions 354 of a dielectric material are arranged between adjacent first fingers 352 and second fingers 353, and also surround the fingers 352, 353. In other words, the fingers 352, 353 are buried in the dielectric material. In some embodiments, the portions 354 comprise the dielectric material of a lower dielectric layer 324 (FIG. 3B).

The first fingers 352 configuring the first electrode of the capacitor 300 are continuous with a portion 355 of the semiconductor material of the semiconductor layer 322. The portion 355 of the semiconductor layer 322 comprises a doped region 356 (FIG. 3B) which is in ohmic contact with a contact structure 333 which is electrically coupled to a conductive through via 343. As illustrated in FIG. 3B, the conductive through via 343 extends through an upper dielectric layer 326, the semiconductor layer 322, the lower dielectric layer 324, a passivation layer 314 to be electrically coupled to a conductive pattern 315-2 of an IC structure 312. A contact pad 304 is over and contacting the portion 355 of the semiconductor material. A passivation layer 329 is over the contact pad 304 and the contact structure 333. In the example configuration in FIG. 3A, the contact pad 304 is physically separated from the contact structure 333 and the conductive through via 343. In the example configuration in FIG. 3B, the contact pad 304 is continuous to the contact structure 333. The contact pad 304 provides electrical connection to the first electrode of the capacitor 300 from other circuit elements in the same second substrate containing passive circuits, or from external circuitry. The conductive through via 343 provides electrical connection from the first electrode of the capacitor 300 to the IC structure 312. In at least one embodiment, at least one of the contact pad 304 or conductive through via 343 is omitted.

The second fingers 353 configuring the second electrode of the capacitor 300 are continuous with a portion 357 of the semiconductor material of the semiconductor layer 322. A contact structure 334, a conductive through via 344 and a contact pad 305 are formed over or through the portion 357 of the semiconductor material. In some embodiments, the contact structure 334, conductive through via 344 and contact pad 305 are configured similarly to the contact structure 333, conductive through via 343 and contact pad 304. In FIG. 3B, a conductive pattern 315-3 of the IC structure 312 overlaps the first fingers 352 and second fingers 353 of the capacitor 300 along the thickness direction, and is configured as a shielding for the capacitor 300 against interference, noises and/or crosstalk from the IC structure 312.

Capacitance and breakdown voltage are parameters of the capacitor 300 that are considered by semiconductor device designers. The capacitance and/or breakdown voltage of the capacitor 300 are customizable based on various other parameters including, but not limited to, electrical properties of the semiconductor material and the dielectric material forming the capacitor 300, a thickness dl (FIG. 3B) of the semiconductor layer 322, a spacing s (FIG. 3A) between adjacent first and second fingers 352, 353, the number of fingers 352, 353 in the capacitor 300, a width w1 and a length 11 (FIG. 3A) of each fingers, or the like. In at least one embodiment, it is possible to provide a comb-type capacitor, as described with respect to FIGS. 1, 3A-3C, with a higher capacitance (e.g., up to 500 pF level) and a higher breakdown voltage (e.g., greater than 100V) than MIM and/or MOM capacitors in other approaches. This is an advantage over the other approaches in which it is difficult to achieve both high capacitance and high breakdown voltage at the same time. Further, MIM and/or MOM capacitors in other approaches need a large chip area when high capacitance is required. There is also a possibility that noise is coupled to the power supply on board and impacts analog output of one or more passive circuits using MIM and/or MOM capacitors in the other approaches. In contrast, at least one embodiment, it is possible to provide high capacitance without requiring a large chip area, by varying one or more parameters as described herein. In some embodiments, noise coupling to a capacitor and/or a passive circuit containing such a capacitor is effectively prevented or at least reduced by a shielding conductive pattern, as described herein. In some embodiments, a material of the shielding conductive pattern comprises at least one of Ti, Al, TiN, or the like.

FIG. 3D is a schematic plan view of a resistor 370 in a semiconductor device, in accordance with some embodiments. In some embodiments, the resistor 370 is included in the same second substrate containing passive circuits as the capacitor 300. In an example, the resistor 370 is included in the second substrate 120 described with respect to FIG. 1. A cross-section view along line III-III in FIG. 3D is similar to the cross-section view in FIG. 3B.

The resistor 370 includes a continuous strip 371 of the semiconductor material of the semiconductor layer 322. The strip 371 in FIG. 3D has a meandering or zig-zig shape. This is an example, and other shapes are within the scopes of various embodiments. The opposite ends of the strip 371 are continuous correspondingly to a first portion 372 and a second portion 373 of the semiconductor material. A resistance of the resistor 370 is customizable based on various parameters including, but not limited to, electrical properties of the semiconductor material, a thickness dl (FIG. 3B) of the semiconductor layer 322, a width w2 of the strip 371, and a length of the strip 371 between the first portion 372 and second portion 373, or the like.

A contact structure 374, a conductive through via 375 and a contact pad 376 are formed over or through the first portion 372 of the semiconductor material. A contact structure 377, a conductive through via 378 and a contact pad 379 are formed over or through the second portion 373 of the semiconductor material. In some embodiments, one or more of the contact structures 374, 377, conductive through vias 375, 378 and contact pads 376, 379 are configured correspondingly similarly to the contact structure 333, conductive through via 343 and contact pad 304. The strip 371, the first portion 372 and the second portion 373 of the semiconductor material are surrounded by, or buried in, a portion 380 of a dielectric material, e.g., the dielectric material of the lower dielectric layer 324.

Figure 3E:
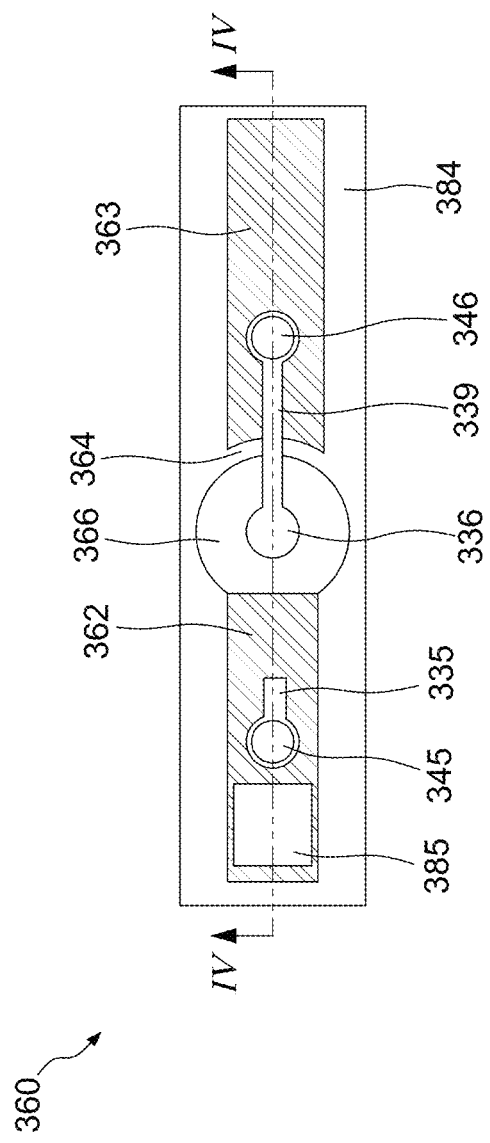
FIGS. 3E-3F are correspondingly a schematic plan view and a schematic cross-section view of a Schottky diode, in accordance with some embodiments.
Figure 3F:
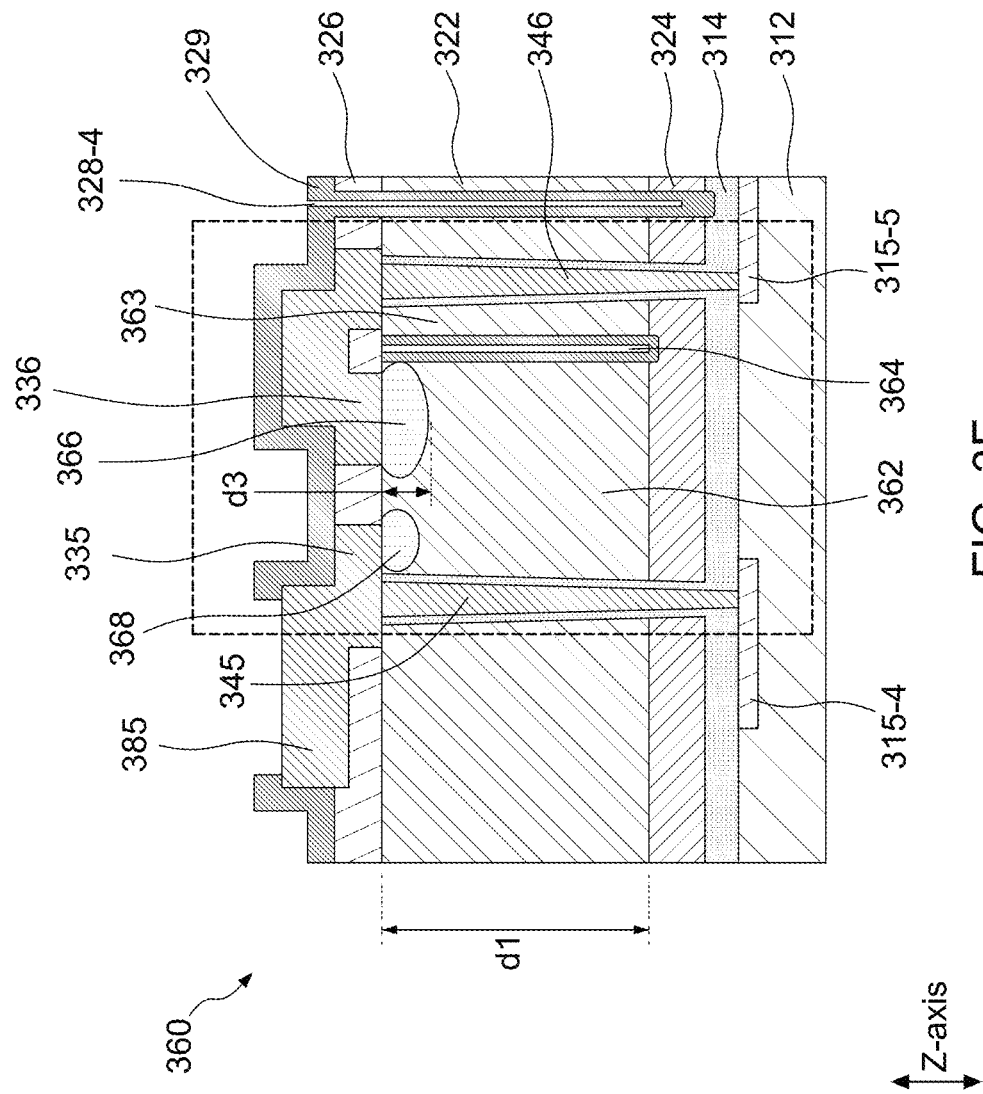

FIGS. 3E-3F are correspondingly a schematic plan view and a schematic cross-section view of a Schottky diode 360, in accordance with some embodiments. FIG. 3F is a cross-section taken along lines IV-IV in FIG. 3E. In some embodiments, the Schottky diode 360 corresponds to one or more of the Schottky diodes 160, 161. In at least one embodiment, the Schottky diode 360 is included in the same second substrate containing passive circuits as the capacitor 300 and/or the resistor 370. Components in FIGS. 3E-3F having corresponding components in FIG. 1 are designated by the reference numerals of FIG. 1 increased by two hundred.

The Schottky diode 360 is configured by a contact structure 336 and a portion 362 of the semiconductor layer 322 in contact with the contact structure 336. The portion 362 of the semiconductor layer 322 is electrically isolated from an adjacent portion 363 of the semiconductor layer 322 by an isolation trench 364 including a dielectric material. In the example configuration in FIGS. 3E-3F, the isolation trench 364 comprises the dielectric material of the lower dielectric layer 324. A portion 384 of the dielectric material of the lower dielectric layer 324 surrounds the portions 362, 363 of the semiconductor material. In other words, the portions 362, 363 of the semiconductor material are buried in the dielectric material. An isolation trenches 328-4 electrically isolates the portion 363 of the semiconductor layer 322 from other parts of the semiconductor layer 322. The portion 362 of the semiconductor layer 322 comprises a doped region 366 (FIG. 3F) in Schottky contact with the contact structure 336. The contact structure 336 is electrically coupled to a conductive through via 346 by a connector 339 which extends across the isolation trench 364. The conductive through via 346 is electrically coupled to the conductive pattern 315-5 of the IC structure 312. As a result, a first terminal (e.g., an anode or a cathode) of the Schottky diode 360 is electrically coupled to the IC structure 312. A contact pad 385 is over and contacting the portion 362 of the semiconductor material. In the example configuration in FIG. 3E, the contact pad 385 is physically separated from the contact structure 335 and the conductive through via 345. In the example configuration in FIG. 3F, the contact pad 385 is continuous to the contact structure 335. The contact pad 385 provides electrical connection to the Schottky diode 360 from other circuit elements in the same second substrate containing passive circuits, or from external circuitry. The conductive through via 345 provides electrical connection from the Schottky diode 360 to the IC structure 312. In at least one embodiment, at least one of the contact pad 385 or conductive through via 345 is omitted. The portion 362 of the semiconductor layer 322 further comprises a doped region 368 in ohmic contact with a contact structure 335. A connector (not numbered) electrically couples the contact structure 335 to a conductive through via 345 which is electrically coupled to the conductive pattern 315-4 in the IC structure 312. As a result, a second terminal (e.g., a cathode or an anode) of the Schottky diode 360 is electrically coupled to the IC structure 312. In at least one embodiment, at least one of the described connections from the Schottky diode 360 to the IC structure 312 is omitted.

Figure 3G:
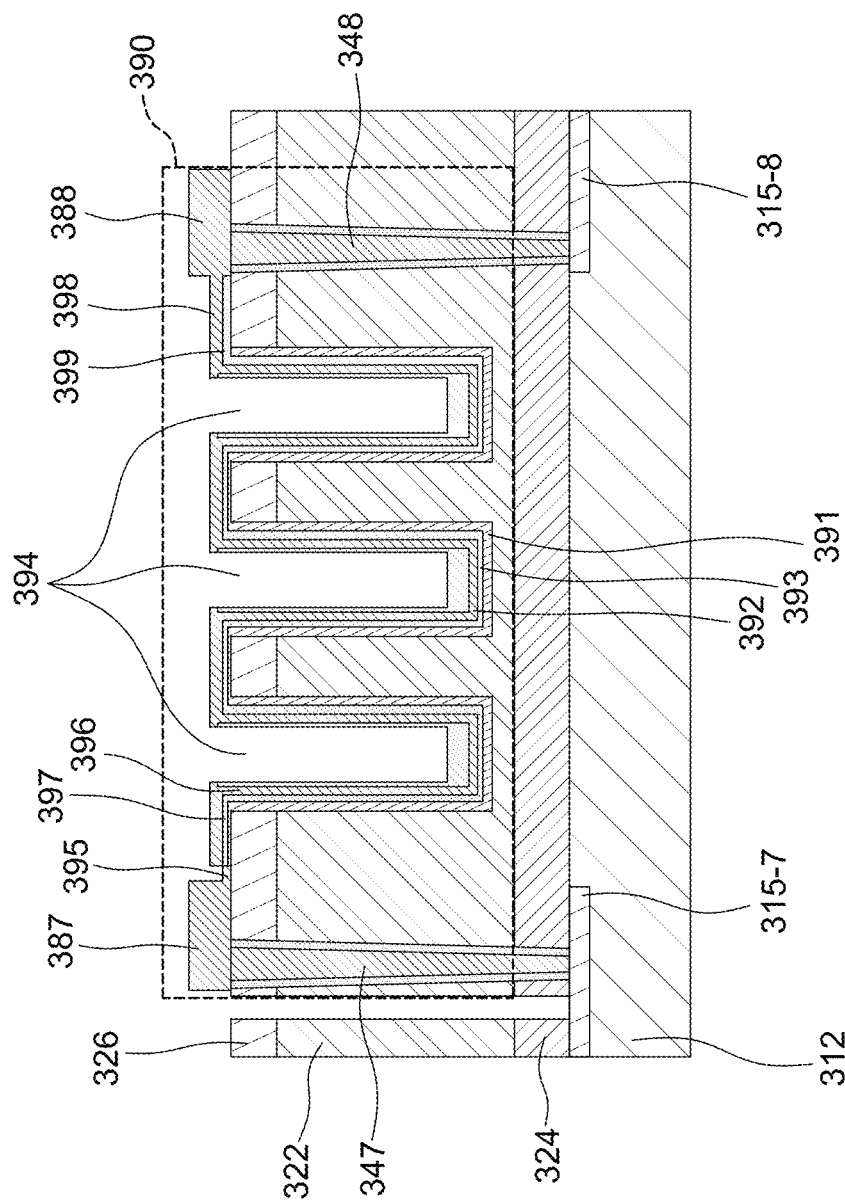
FIG. 3G is a schematic cross-section view of a capacitor in a semiconductor device, in accordance with some embodiments.

FIG. 3G is a schematic cross-section view of a capacitor 390 in a semiconductor device, in accordance with some embodiments. In some embodiments, the capacitor 390 is included in a second substrate containing passive circuits. In at least one embodiment, the capacitor 390 is included in the same second substrate containing passive circuits as the capacitor 300 and/or the resistor 370 and/or the Schottky diode 360. In at least one embodiment, the capacitor 390 is included in the semiconductor device 100, in place of or in addition to at least one of the capacitors 150, 151. Components in FIG. 3G having corresponding components in FIG. 1 are designated by the reference numerals of FIG. 1 increased by two hundred. For simplicity, the passivation layer 314 is omitted in FIG. 3G.

In the example configuration in FIG. 3G, the capacitor 390 is a three-dimensional (3D) Metal-Insulator-Metal (MIM) or Metal-Oxide-Metal (MOM) capacitor. The capacitor 390 comprises a first electrode 391 (also referred to as a bottom or lower electrode), a second electrode 392 (also referred to as a top or upper electrode), and an insulating material or dielectric material 393 sandwiched between the first electrode 391 and second electrode 392. The first electrode 391, dielectric material 393 and second electrode 392 are sequentially deposited over sidewalls and bottoms of one or more trenches 394. The one or more trenches 394 are formed by an etching process and extend downwardly along the thickness direction through the upper dielectric layer 326 and into the semiconductor layer 322. In some embodiments, the one or more trenches 394 extend through the semiconductor layer 322 and into the lower dielectric layer 324. Example materials of one or more of the first electrode 391 and second electrode 392 include, but are not limited to, Al, Ti, TiN, TaN, Co, Ag, Au, Cu, Ni, Cr, Hf, Ru, W, Pt, or the like. Example materials of the dielectric material 393 include, but are not limited to, $HfO_2$, $Hfl_{-x}Zr_xO_2$, $ZrO_2$, $TiO_2$, $NiO$, $TaO_x$, $Cu_2O$, $Nb_2O_5$, $Al_2O_3$, or the like.

Each of the first electrode 391, dielectric material 393, second electrode 392 extend continuously over the sidewalls and bottoms of the one or more trenches 394. A portion 395 of the first electrode 391 is electrically coupled to a contact pad 387. The contact pad 387 is over and in electrical contact with an upper end of a conductive through via 347. A lower end of the conductive through via 347 is over and in electrical contact with a conductive pattern 315-7 of the IC structure 312. The conductive through via 347 is electrically isolated from the semiconductor layer 322 by a dielectric layer (not numbered) lining a sidewall of the conductive through via 347, as described herein. The portion 395 of the first electrode 391 is electrically isolated from an adjacent portion 396 of the second electrode 392 by a corresponding portion 397 of the dielectric material 393. An opposite end (not numbered) of the first electrode 391 is electrically isolated from an adjacent portion 398 of the second electrode 392 by a corresponding portion 399 of the dielectric material 393. The portion 398 of the second electrode 392 is electrically coupled to a contact pad 388. The contact pad 388 is over and in electrical contact with an upper end of a conductive through via 348. A lower end of the conductive through via 348 is over and in electrical contact with a conductive pattern 315-8 of the IC structure 312. The conductive through via 348 is electrically isolated from the semiconductor layer 322 by a dielectric layer (not numbered) lining a sidewall of the conductive through via 348, as described herein. The conductive pads 387 and 388 provide electrical connection from the IC structure 312 correspondingly to the first electrode 391 and second electrode 392 of the capacitor 390. Other electrical connections of the capacitor 390 to the IC structure 312 and/or other circuit elements in the second substrate containing passive circuits are within the scopes of various embodiments.

In some embodiments, the one or more trenches 394, in a plan view (not shown), has a comb-shaped structure, for example, as described with respect to FIG. 3A. In at least one embodiment, the one or more trenches 394, in a plan view (not shown), comprises concentric circles. Other shapes of the one or more trenches 394 in a plan view are within the scopes of various embodiments. In the example configuration in FIG. 3G, the one or more trenches 394 have substantially vertical sidewalls along the Z-axis or the thickness direction of the IC structure 312. In at least one embodiment, the one or more trenches 394 have a tapered profile (not shown) with sidewalls being oblique with respect to the Z-axis and a trench width decreasing downward towards the bottoms of the one or more trenches 394. In some embodiments, such a tapered profile provides a sufficient space for sequential deposition of multiple continuous layers corresponding to the first electrode 391, dielectric material 393, second electrode 392 over the bottoms and sidewalls of the one or more trenches 394. In an example configuration, the trench width of a trench 394 in a horizontal direction in FIG. 3G is about 5 μm and a pitch (e.g., a center-to-center distance) between adjacent trenches 394 in the horizontal direction in FIG. 3G is about 10 μm. Other configurations of the one or more trenches 394 are within the scopes of various embodiments.

In other approaches, a MIM or MOM capacitor comprises several material layers deposited on a flat surface. As a result, the capacitance of a MIM or MOM capacitor in accordance with the other approaches is limited by an area of the flat surface. In contrast, in accordance with one or more embodiments, a MIM or MOM capacitor, such as the capacitor 390, is a 3D structure having multiple layers corresponding to the first electrode 391, dielectric material 393, second electrode 392 sequentially deposited over sidewalls and bottoms of one or more trenches 394. The additional areas corresponding to the sidewalls of the one or more trenches 394 increase the capacitance of the 3D capacitor 390, which provide one or more advantages as described herein, e.g., high capacitance without requiring a large chip area.

In some embodiments, the provision of one or more capacitors, resistors or Schottky diodes in a second substrate on top a first substrate with active circuits make it possible to provide one or more passive circuits that support and/or improve performance and/or reliability of the active circuits in the first substrate. Examples of passive circuits include, but are not limited to, a DC power buffer, a pre-signal filter, a voltage clamping circuit, an electrostatic discharge (ESD) circuit, a rectifier, or a charge pump.

Figure 4A:
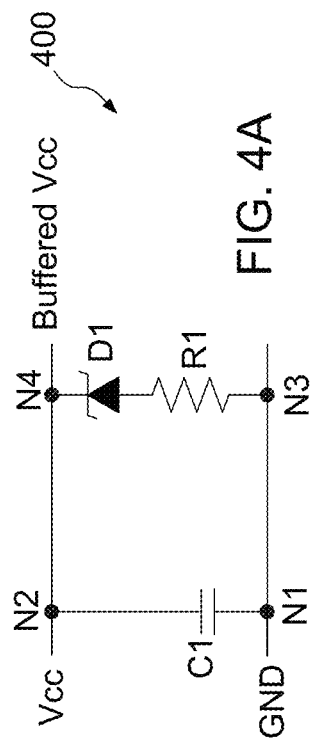
FIGS. 4A-4B are correspondingly a circuit diagram and a schematic plan view of an electrostatic discharge (ESD) circuit, in accordance with some embodiments.
Figure 4B:
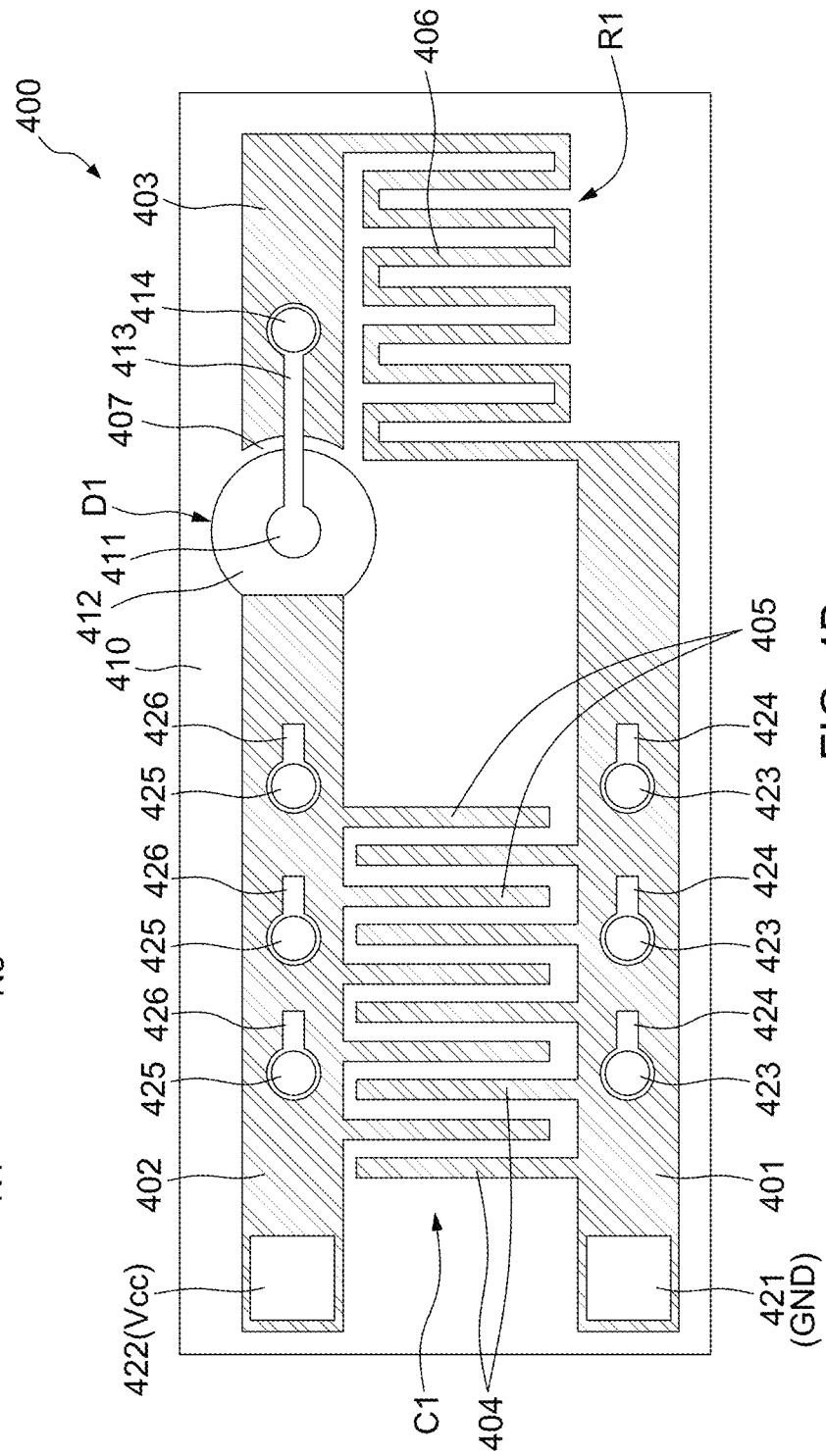

FIGS. 4A-4B are correspondingly a circuit diagram and a schematic plan view of an electrostatic discharge (ESD) circuit 400, in accordance with some embodiments.

In FIG. 4A, the ESD circuit 400 comprises a capacitor C1, a Schottky diode D1 and a resistor R1. The capacitor C1 is electrically coupled between a node N1 having a ground voltage GND, and a node N2 having a power supply voltage Vcc. The Schottky diode D1 and the resistor R1 are serially coupled between a node N3 and a node N4. The nodes N3, N4 are correspondingly coupled to the nodes N1, N2. In at least one embodiment, the voltages Vcc and GND are supplied to the nodes N2, N1 from an external power source, whereas a buffered voltage Vcc is supplied by the ESD circuit 400 through nodes N4, N3 to active circuits of an IC device.

In FIG. 4B, the ESD circuit 400 is implemented in a semiconductor device corresponding to the semiconductor device 100. In some embodiments, the ESD circuit 400 is formed in a second substrate corresponding to the second substrate 120 and is configured to provide buffered voltage Vcc to a first substrate corresponding to the first substrate 110. The ESD circuit 400 comprises a semiconductor material having a first portion 401, a second portion 402, and a third portion 403. The semiconductor material further comprises first fingers 404 continuous to the first portion 401, second fingers 405 continuous to the second portion 402, and a strip 406 extending between and continuous to both the first portion 401 and third portion 403. The third portion 403 is disconnected and spaced from the second portion 402 by an isolation trench 407. All of the first portion 401, second portion 402, third portion 403, first fingers 404, second fingers 405, and strip 406 are surrounded by and/or buried in a dielectric material 410. The first fingers 404 and second fingers 405 are interdigitated with each other and configure the capacitor C1, as described with respect to FIGS. 3A-3C. The strip 406 configures the resistor R1, as described with respect to FIG. 3D. A contact structure 411 is in Schottky contact with a doped region 412 of the second portion 402, to configure the Schottky diode D1, as described with respect to FIGS. 3E-3F. The contact structure 411 is electrically coupled by a connector 413 to another contact structure 414. The contact structure 414 is in electrical contact, e.g., ohmic contact, with the third portion 403 to realize the serial connection between the Schottky diode D1 and resistor R1. The capacitor C1 is electrically coupled to the Schottky diode D1 by the semiconductor material of the second portion 402. The capacitor C1 is electrically coupled to the resistor R1 by the semiconductor material of the first portion 401. In some embodiments, the contact structure 414 is not coupled to a conductive through via.

Contact pads 421, 422 are correspondingly formed over the first portion 401, second portion 402. In some embodiments, the contact pads 421, 422 correspond to contact pads 304, 305. The contact pads 421, 422 are configured to be coupled to an external power source to correspondingly receive the voltages GND, Vcc. The contact pads 421, 422 correspond to nodes N1, N2. A plurality of conductive through vias 423, with associated contact structures 424, are formed over or through the first portion 401 of the semiconductor material, to electrically couple the ESD circuit 400 with the active circuits in the first substrate. The conductive through vias 423 and associated contact structures 424 correspond to the node N3. A plurality of conductive through vias 425, with associated contact structures 426, are formed over or through the second portion 402 of the semiconductor material, to electrically couple the ESD circuit 400 with the active circuits in the first substrate. The conductive through vias 425 and associated contact structures 426 correspond to the node N4. In some embodiments, the conductive through vias 423 with associated contact structures 424 and the conductive through vias 425 with associated contact structures 426 correspond to the conductive through via 343 with the associated contact structure 333. In at least one embodiment, the ESD circuit 400 on the second substrate is configured to supply Vcc with buffer and ESD protection to active circuits on the first substrate by way of conductive through vias.

FIGS. 4C-4D are correspondingly a circuit diagram and a schematic plan view of a charge pump 450, in accordance with some embodiments.

In FIG. 4C, the charge pump 450 comprises capacitors C11-C17, and Schottky diodes D11-D17. The charge pump 450 has input nodes Vin-Clk and GND correspondingly configured to receive input voltage Vin-Clk and ground voltage GND from an external circuit 460. The external circuit 460 comprises a power source PS and an inverter INV. The power source PS is configured to provide a voltage VIN to the inverter INV. The inverter INV is configured to output the voltage Vin-Clk to the charge pump 450 in response to a clock signal Clk. The charge pump 450 further comprises output nodes VOUT1-VOUT4 from which charged voltages are provided to active circuits in an IC structure. Schottky diodes D11-D17 are serially coupled between nodes Vin-Clk and VOUT4. Schottky diodes D11, D12 are serially coupled between nodes Vin-Clk and VOUT1. Schottky diodes D13, D14 are serially coupled between nodes VOUT1 and VOUT2. Schottky diodes D15, D16 are serially coupled between nodes VOUT2 and VOUT3. Schottky diode D17 is coupled between nodes VOUT3 and VOUT4. Capacitor C11 is coupled between nodes Vin-Clk and VOUT1. Capacitor C12 is coupled between nodes VOUT1 and VOUT2. Capacitor C13 is coupled between nodes VOUT2 and VOUT3. Capacitor C17 is coupled between nodes VOUT4 and GND. Capacitor C14 is coupled in parallel with Schottky diodes D12, D13 coupled in series. Capacitor C15 is coupled in parallel with Schottky diodes D14, D15 coupled in series. Capacitor C16 is coupled in parallel with Schottky diodes D16, D17 coupled in series.

In FIG. 4D, the charge pump 450 is implemented in a semiconductor device corresponding to the semiconductor device 100. In some embodiments, the charge pump 450 is formed in a second substrate corresponding to the second substrate 120 and is configured to provide charged voltages to a first substrate corresponding to the first substrate 110, by way of conductive through vias 451-454 corresponding to nodes VOUT1-VOUT4. The capacitors C11-C17 and Schottky diodes D11-D17 are configured as described with respect to FIGS. 3A-3C and 3E-3F, and comprise a semiconductor material buried in a dielectric material 458. Electrical connections among capacitors C11-C17 and Schottky diodes D11-D17 are implemented by various sections 459 of the semiconductor material.

In some embodiments, other passive circuits including, but not limited to, DC power buffers, pre-signal filters, voltage clamping circuits, rectifiers, or the like are implemented in various semiconductor devices by arranging and coupling one or more circuit elements in manners similar to those described with respect to one or more of FIGS. 3A-3F and 4A-4D. In at least one embodiment, passive circuits, second substrates and/or semiconductor devices containing passive circuits as described herein make it possible to achieve one or more advantages described herein.

Figure 5A:
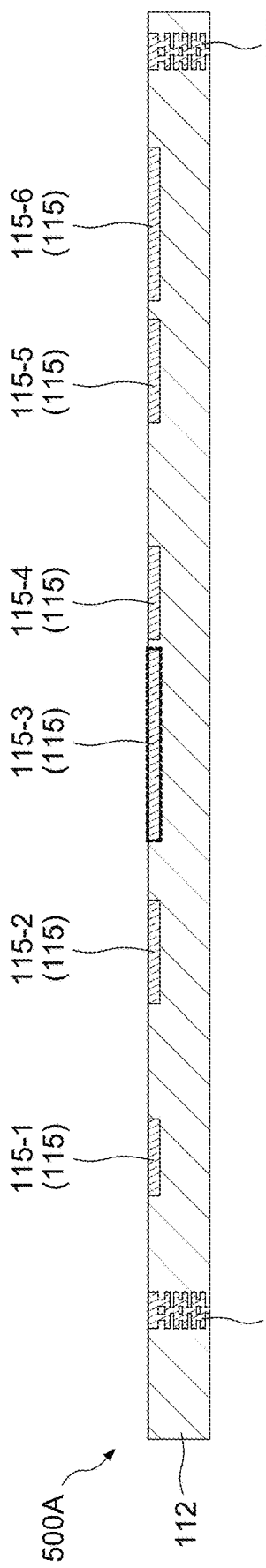
FIGS. 5A-5N include schematic cross-section views of a semiconductor device at various stages during a manufacturing process, in accordance with some embodiments.
Figure 5B:
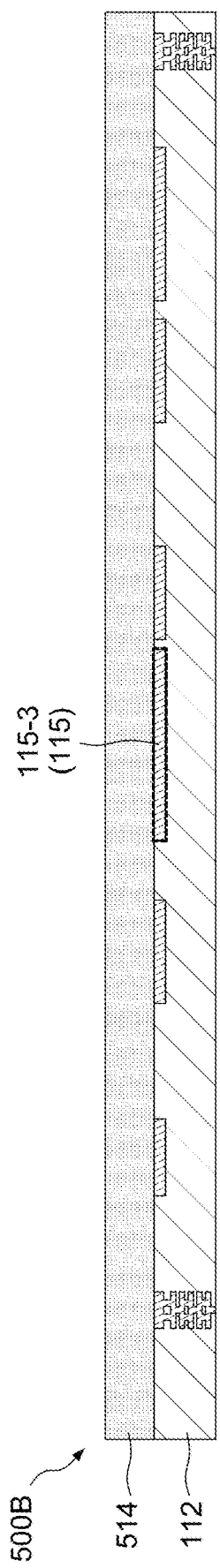
Figure 5C:
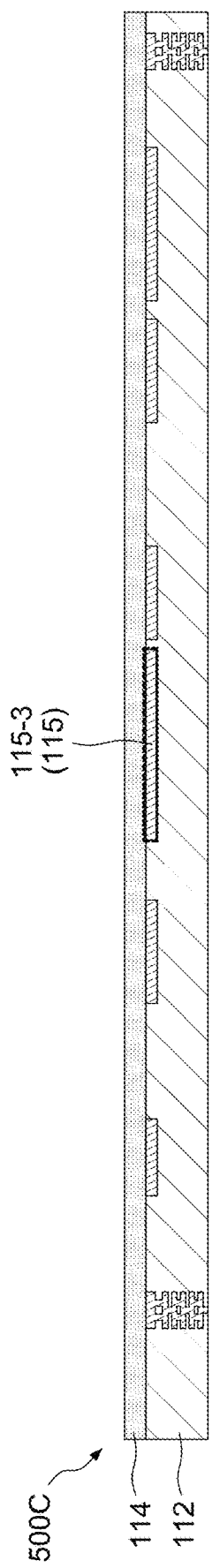
Figure 5H:
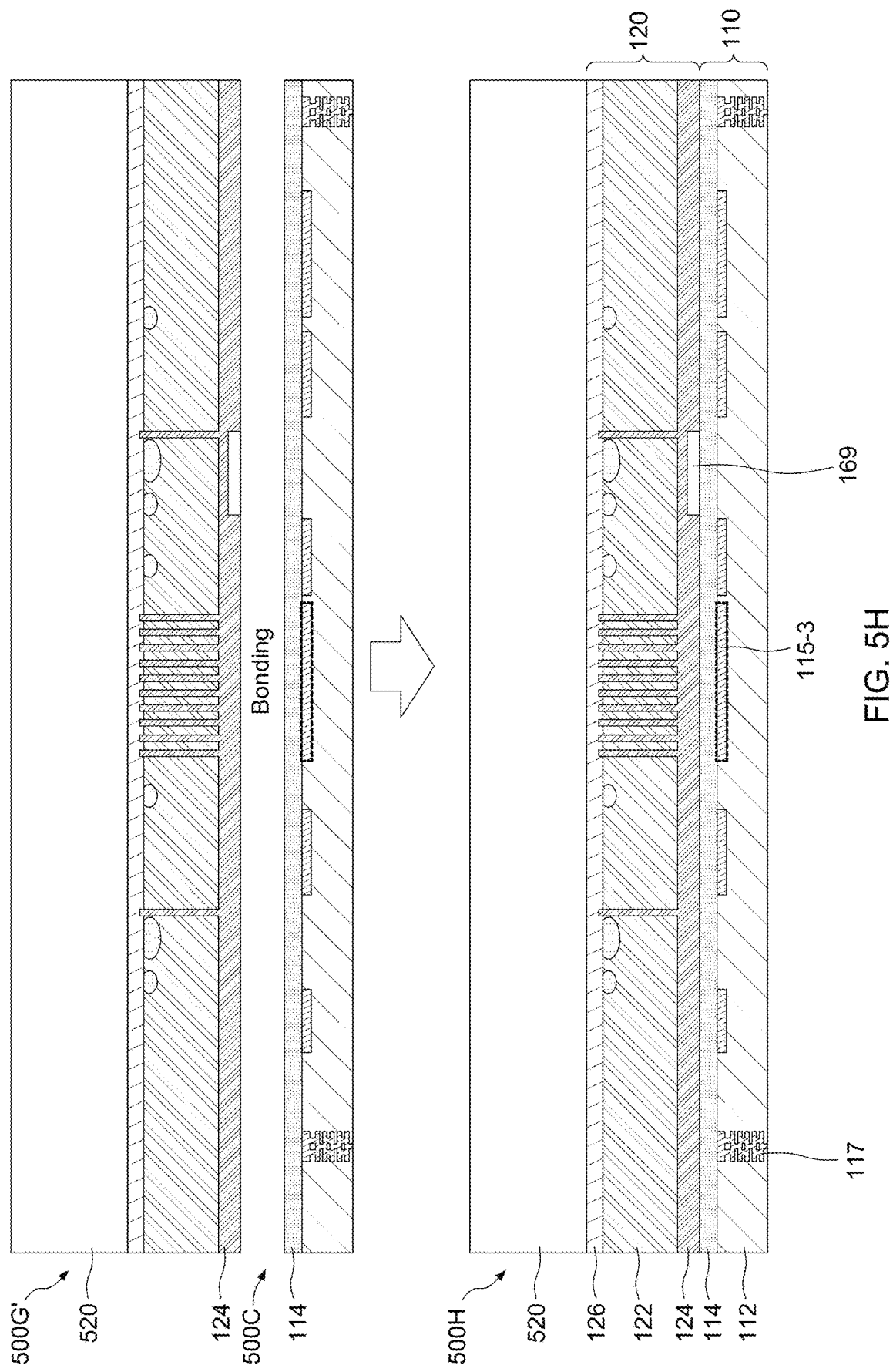
Figure 5I:
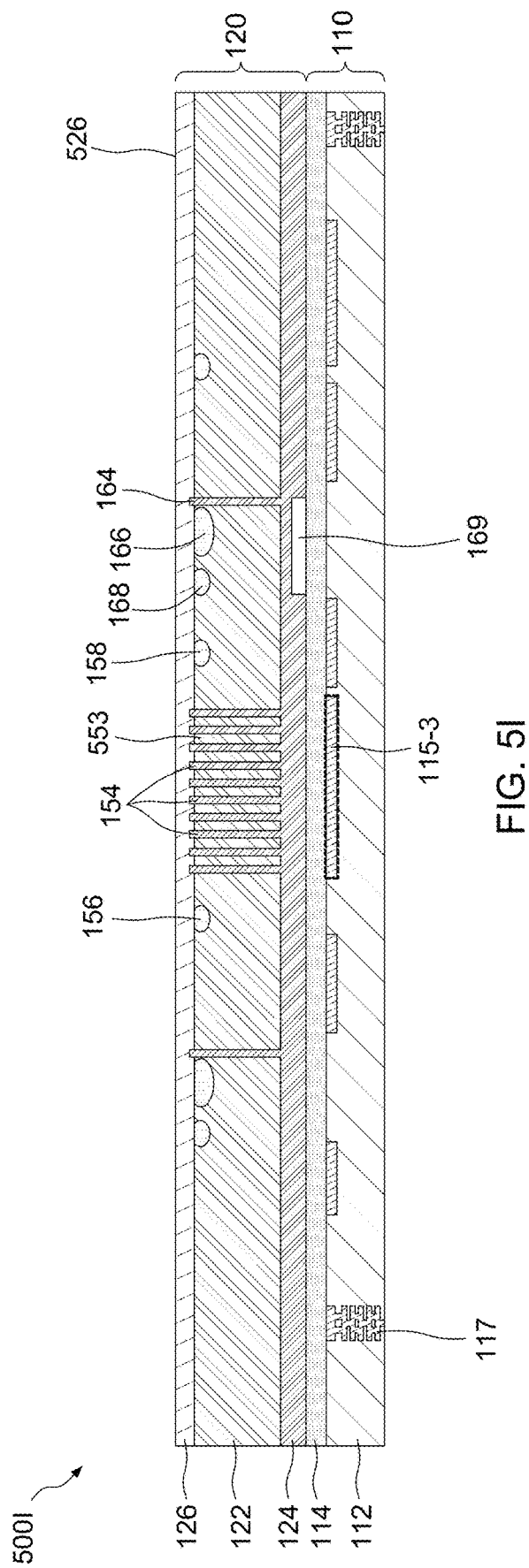
Figure 5J:
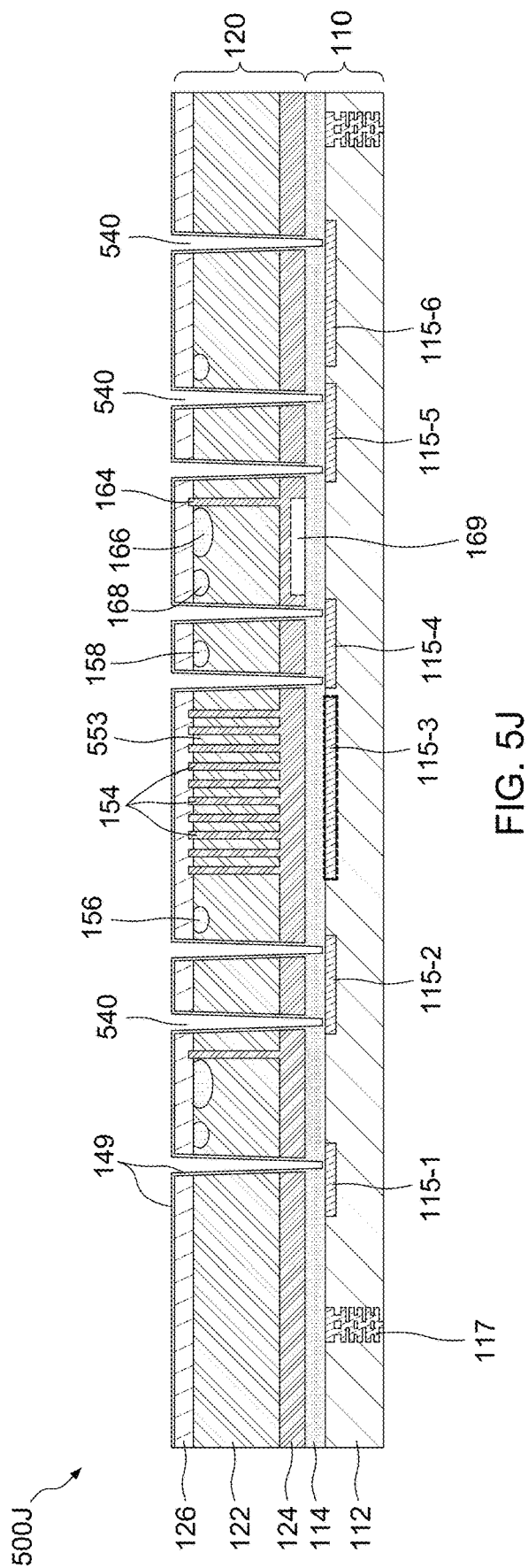
Figure 5K:
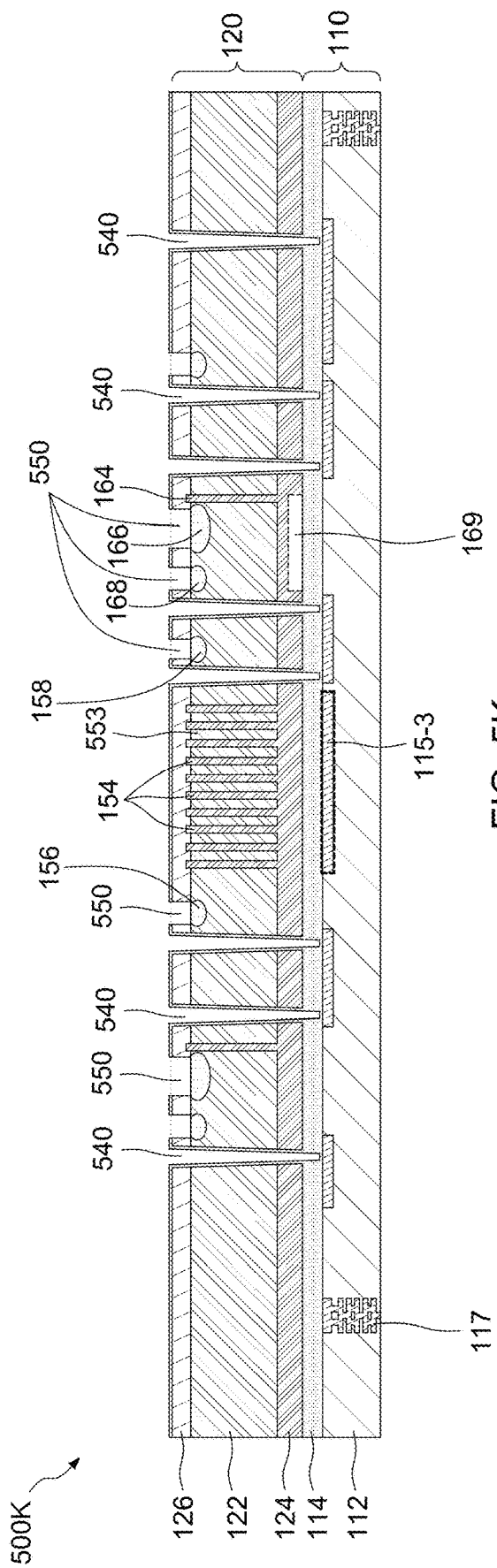
Figure 5L:
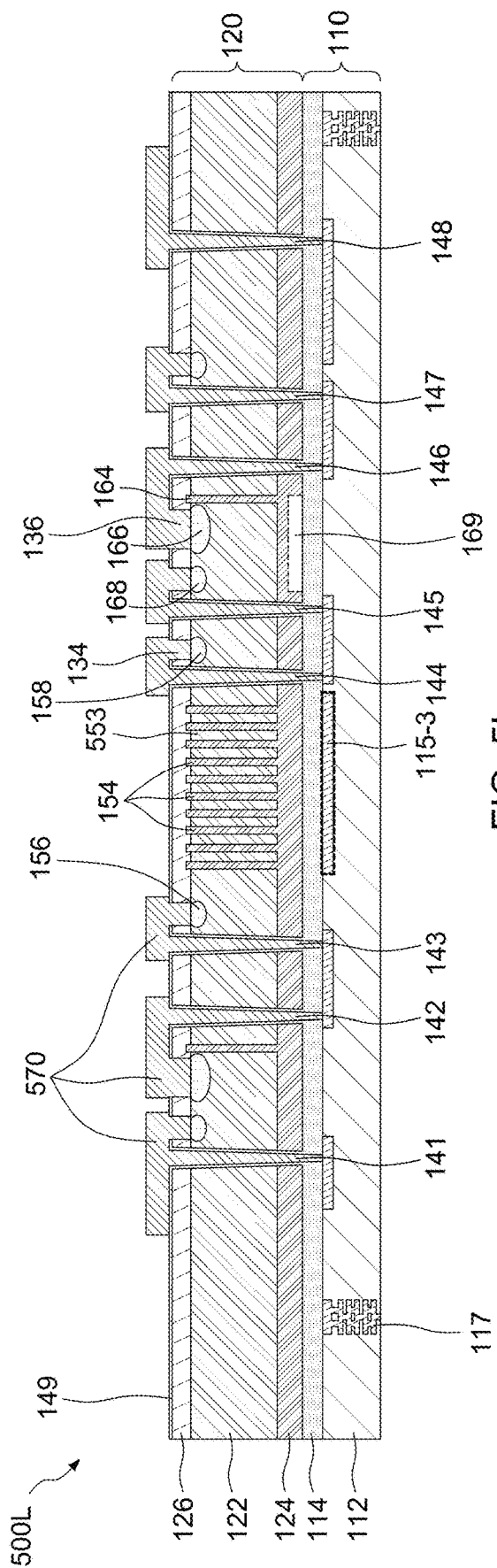
Figure 5M:
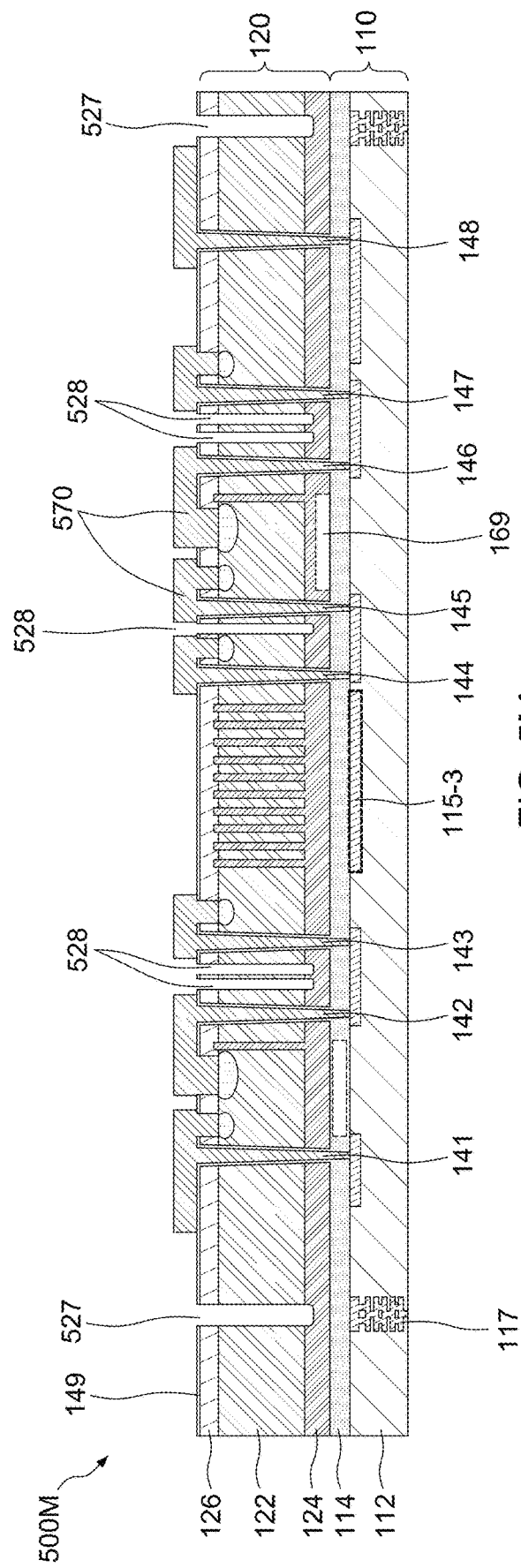
Figure 5N:
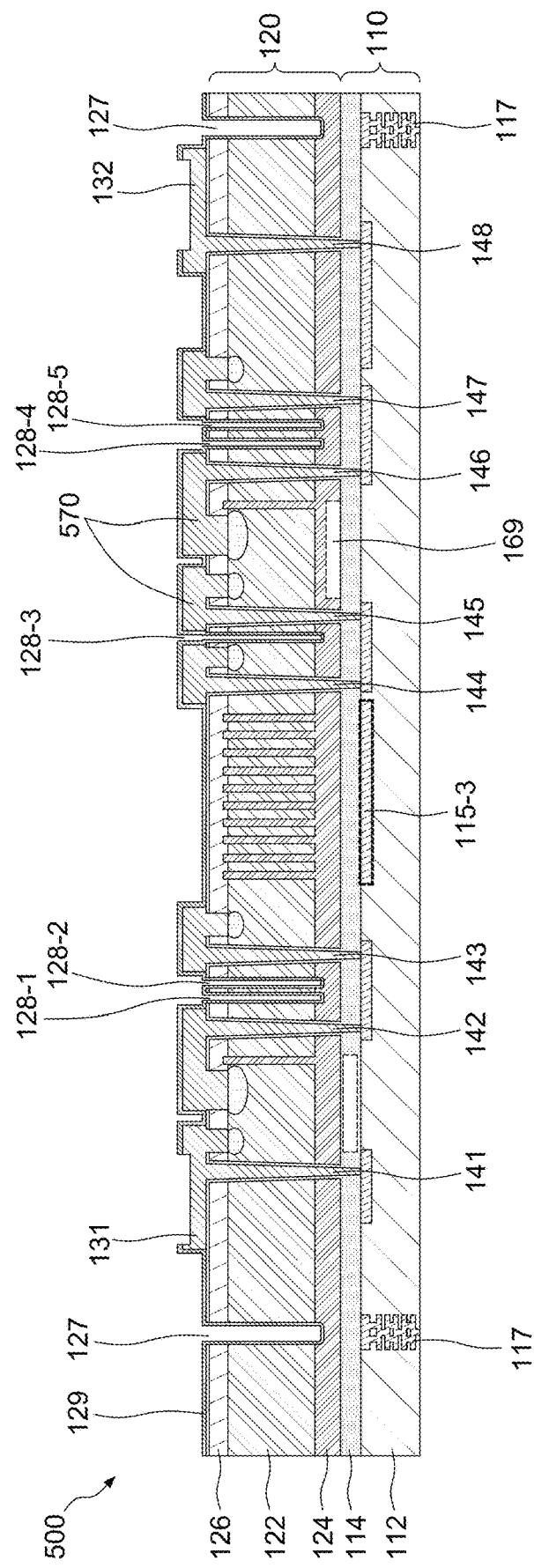

FIGS. 5A-5N include schematic cross-section views of a semiconductor device 500 at various stages during a manufacturing process, in accordance with some embodiments. In some embodiments, the semiconductor device 500 corresponds to the semiconductor device 100, and/or includes one or more circuit elements described with respect to FIGS. 3A-3F, and/or includes one or more passive circuits described with respect to FIGS. 4A-4D. Components in FIGS. 5A-5N having corresponding components in FIGS. 1-2 are designated by the same reference numerals of FIGS. 1-2.

Operations in FIGS. 5A-5C are performed to fabricate a first substrate, operations in FIGS. 5D-5G are performed to fabricate a second substrate, and operations in FIGS. 5H-5N are performed when the first substrate and the second substrate are bonded together. The operations for forming the second substrate in FIGS. 5D-5G are performed independently from, before, simultaneously with, or after the operations for forming the first substrate in FIGS. 5A-5C.

In FIG. 5A, an IC structure 112 is manufactured. In some embodiments, the IC structure 112 comprises a redistribution structure over active circuits containing active circuit elements, such as transistors. In at least one embodiment, the IC structure 112 comprises a redistribution structure, without active circuits.

For an IC structure comprising active circuits, an example manufacturing process is described with reference to FIG. 2. The manufacturing process starts from a substrate, such as the substrate 252. The substrate 252 comprises, in at least one embodiment, a silicon substrate. The substrate 252 comprises, in at least one embodiment, silicon germanium (SiGe), gallium arsenic, or other suitable semiconductor materials. In some embodiments, multiple active regions are formed in the substrate 252. Isolation structures (not shown) are formed in the substrate 252, e.g., by etching corresponding areas of the substrate 252 and filling the etched areas with insulating material.

Various transistors are formed over the substrate 252 in a front-end-of-line (FEOL) processing. For example, a gate dielectric is deposited over the substrate 252 having the active regions. Example materials of the gate dielectric include, but are not limited to, silicon oxide such as thermally grown silicon oxide, a high-k dielectric such as a metal oxide, or the like. Example high-k dielectrics include, but are not limited to, $HfO_2$, $Ta_2O_5$, $Al_2O_3$, $TiO_2$, TiN, $ZrO_2$, SnO, $SnO_2$, or the like. In some embodiments, the gate dielectric is deposited over the substrate 252 by atomic layer deposition (ALD) or other suitable techniques. A gate material is deposited or formed over the gate dielectric. Example materials of the gate material include, but are not limited to, polysilicon, metal, Al, AlTi, Ti, TiN, TaN, Ta, TaC, TaSiN, W, WN, MoN, and/or other suitable conductive materials. In some embodiments, the gate material is deposited by chemical vapor deposition (CVD), physical vapor deposition (PVD or sputtering), plating, atomic layer deposition (ALD), and/or other suitable processes. The gate dielectric and gate material are patterned into a plurality of gate structures, each comprising a gate electrode 255 and a underlying gate dielectric layer 256. In some embodiments, the patterning of the gate dielectric and gate material includes a photolithography operation.

The gate structures are used as a mask to perform ion implantation in various regions of the active regions adjacent the gate structures, to obtain source/drain regions 254 which comprise N+ implanted regions in a P-well or P-substrate to form N-type transistors with corresponding gate electrodes 255, and/or P+ implanted regions in an N-well or N-substrate to form P-type transistors with corresponding gate electrodes 255. Other types of implantation and/or well are within the scopes of various embodiments. In some embodiments, a spacer (not shown) is deposited around each gate structure. Various contact structures 257 and/or VD vias 259 are correspondingly formed, e.g., by deposition of a conductive material in to spaces between the spacers and/or gate structures, over the source/drain regions 254. VG vias 258 are formed correspondingly over the gate electrodes 255. In some embodiments, where the IC structure 112 contains no active circuits, the FEOL processing is omitted.

After the FEOL processing, a back-end-of-line (BEOL) processing is performed to form a redistribution structure 260 over the transistors to electrically couple various elements or circuits of the IC structure 112 with each other, and with external circuitry. In at least one embodiment, the redistribution structure 260 comprises sequentially overlying metal and via layers. The overlying metal layers and via layers correspondingly comprise metal layers M0, M1, or the like, and via layers V0, V1, or the like. In at least one embodiment, the redistribution structure 260 is manufactured sequentially layer by layer upward from the substrate 252, for example, by repeatedly performing a damascene process. In such a damascene process, a dielectric layer is deposited over the substrate 252 with various transistors and contact features formed thereon. The dielectric layer is patterned to form a damascene structure having underlying via holes corresponding to conductive vias of a via layer Vk to be formed later, and overlying recessed features corresponding to conductive patterns of a metal layer Mk+1 to be formed latter. An example patterning process to form the damascene structure comprises two or more photolithographic patterning and anisotropic etching steps to first form the underlying via holes, then form the overlying recessed features. A conductive material is deposited over the substrate 252 to fill in the damascene structure to obtain the conductive vias in the via layer Vk and overlying conductive patterns in the metal layer Mk+1. The described damascene process is performed one or more times to sequentially form vias and conductive patterns of higher via layers and metal layers of the redistribution structure 260 until a top metal layer 115 (FIG. 5A) is completed. Some conductive patterns and via structures in multiple metal layers and via layers of the redistribution structure 260 are stacked and coupled physically and electrically with each other to form a sealing ring 117 (FIG. 5A). A resulting structure 500A is obtained.

In FIG. 5B, a passivation material 514 is deposited over the structure 500A. Example materials of the passivation material 514 include, but are not limited to, an oxide (e.g., $SiO_2$), a nitride (e.g., SiN), an oxy-nitride (e.g., $SiO_xN_y$), SiON, $Al_2O_3$, other dielectric materials, or a combination thereof. Example depositing techniques include, but are not limited to, chemical vapor deposition (CVD), physical vapor deposition (PVD), atomic layer deposition (ALD), other deposition processes, or a combination thereof. A resulting structure 500B is obtained.

In FIG. 5C, the passivation material 514 is planarized and reduced in thickness to obtain a passivation layer 114. An example planarization process includes chemical-mechanical polishing (CMP). Other planarization processes are within the scopes of various embodiments. A resulting structure 500C is obtained. In some embodiments, the structure 500C corresponds to the first substrate 110 described with respect to FIG. 1.

In FIG. 5D, a semiconductor layer 122 having various doped regions is temporarily bonded via a dielectric layer 126 to a carrier substrate 520. In some embodiments, the semiconductor layer 122 comprises a Si layer, a bulk Si substrate or an SOI substrate, the dielectric layer 126 comprises an oxide (e.g., $SiO_2$), and the carrier substrate 520 comprises a bulk Si substrate. Other materials are within the scopes of various embodiments. In some embodiments, a thickness of the semiconductor layer 122 is from 2000 Å (0.2 μm) to 40 μm. The doped regions are formed on a surface 522 (e.g., the lower surface in FIG. 5D) of the semiconductor layer 122 facing or contacting the dielectric layer 126. The doped regions comprise one or more doped regions 156, 158, 168 configured to form ohmic contacts, and at least one doped region 166 configured to form Schottky contact. For simplicity, not all doped regions in FIG. 5D are numbered.

In an example manufacturing process, before being bonded to the carrier substrate 520, the semiconductor layer 122 is arranged with the surface 522 facing upward. Various ion implantation processes are performed to selectively implant various regions of the surface 522 with various dopants and/or at various doping concentrations to configure corresponding ohmic contacts and/or Schottky contacts as described herein. A surface of the carrier substrate 520 is oxidized to form the dielectric layer 126. The carrier substrate 520 with the dielectric layer 126 thereon is bonded to the surface 522 with the doped regions of the semiconductor layer 122. A resulting structure 500D is obtained.

In FIG. 5E, one or more isolation trenches for Schottky diodes, electrodes for one or more capacitors, and/or one or more resistors are etched in the semiconductor layer 122. For example, an etching process is performed to etch the semiconductor layer 122 from a surface 523 opposite to the surface 522 in the thickness direction. Example etching processes include, but are not limited to, a dry etching process, a wet etching process, a reactive ion etching (RIE) process, other etching processes, or a combination thereof. The etching process results in cavities 554, 564 each extending through an entire thickness of the semiconductor layer 122, from the surface 523 to the surface 522. In the example configuration in FIG. 5E, the cavities 554, 564 extend partially into the dielectric layer 126. The cavities 564 are for formation of isolation trenches in Schottky diodes. When electrodes for a capacitor are etched, portions of the semiconductor material of the semiconductor layer 122 surrounded by and/or arranged between the cavities 554 include interdigitated fingers 553 as described with respect to FIG. 3A. When a resistor is etched, a portion of the semiconductor material of the semiconductor layer 122 surrounded by and/or arranged between the cavities 554 includes a continuous strip of the semiconductor material, as described with respect to FIG. 3D. Hereinafter, formation of a capacitor is described. Formation of a resistor is performed in a similar manner. A resulting structure 500E is obtained.

In FIG. 5F, a dielectric layer 124 is deposited over the structure 500E. A dielectric material of the dielectric layer 124 fills in the cavities 554, 564, to surround the interdigitated fingers 553 and to fill in a space between adjacent fingers 553. As a result, interposing portions 154 for a comb-type capacitor and isolation trench 164 for a Schottky diode are obtained, as described with respect to FIG. 1. Example materials of the dielectric layer 124 include, but are not limited to, an oxide (e.g., $SiO_2$), a nitride (e.g., SiN), an oxy-nitride (e.g., $SiO_xN_y$), SiON, $Al_2O_3$, other dielectric materials, or a combination thereof. Example depositing techniques include, but are not limited to, chemical vapor deposition (CVD), physical vapor deposition (PVD), atomic layer deposition (ALD), high density plasma (HDP) deposition, other deposition processes, or a combination thereof. An upper surface 525 of the dielectric layer 124 is planarized, e.g., by a CMP process. A resulting structure 500F is obtained. In some embodiments, the dielectric layer 124 is omitted.

In FIG. 5G, a cavity 169 is formed in at least the dielectric layer 124, e.g., by etching from the surface 525 of the dielectric layer 124. The cavity 169 is configured as a thermal shield of heat dissipator for a later formed Schottky diode. For example, the cavity 169 is formed to overlap, along the thickness direction, the doped regions 166, 168 on the surface 522 of the semiconductor layer 122. A resulting structure 500G is obtained. In some embodiments, the cavity 169 is etched to extend into the semiconductor layer 122. In some embodiments, the cavity 169 is omitted.

In FIG. 5H, the structure 500C corresponding to a first substrate and the structure 500G corresponding to a second substrate are aligned and bonded with each other. For example, the structure 500G is turned upside down to obtain a structure 500G'. The dielectric layer 124 in the structure 500G' faces the passivation layer 114 of the structure 500C. The structure 500C and the structure 500G' are bonded together, e.g., by fusion bonding, at an interface between the passivation layer 114 and the dielectric layer 124. As a result of the bonding, the cavity 169 becomes a buried cavity. A resulting structure 500H comprising the first substrate 110 and second substrate 120 bonded together is obtained.

In FIG. 5I, the carrier substrate 520 is removed from the structure 500H. Example processes for removing the carrier substrate 520 include, but are not limited to, a wafer thinning process, a blanket etch, a planarization process (e.g., CMP), a grinding process, another suitable removal process, or a combination thereof. A resulting structure 500I is obtained.

In FIG. 5J, one or more through vias 540 are etched from an upper surface 526 (FIG. 5I) of the dielectric layer 126, through the dielectric layer 126, semiconductor layer 122, dielectric layer 124, passivation layer 114 to expose various conductive patterns 115-1 to 115-6 in the top metal layer 115 of the redistribution structure in the IC structure 112. For simplicity, some of the through vias 540 are numbered, whereas other through vias are not numbered in FIG. 5J. In some embodiments, the through vias 540 are formed in more than one etching step. Subsequently, a dielectric layer 149 is deposited over the structure 500I with the through vias 540 formed thereon to cover the upper surface 526 of the dielectric layer 126, and also to line the sidewalls and bottoms (i.e., exposed portions of the conductive patterns 115-1 to 115-6) of the through vias 540. An example material of the dielectric layer 149 comprises an oxide, such as silicon oxide. An example deposition process for depositing the dielectric layer 149 comprises plasma-enhanced chemical vapor deposition (PECVD). A resulting structure 500J is obtained.

In FIG. 5K, one or more contact openings 550 are etched through the dielectric layer 149 and the dielectric layer 126, to expose the doped regions 156, 158, 166, 168 in the underlaying semiconductor layer 122. A resulting structure 500K is obtained.

In FIG. 5L, a conductive material is deposited over the structure 500K to fill in the through vias 540 and the contact openings 550. The filled in through vias 540 become conductive through vias 141-148. The filled in contact openings 550 become various contact structures, e.g., 134, 136, as described with respect to FIGS. 1, 3A-3F. In some embodiments, the dielectric layer 149 at the bottoms of the through vias 540 is removed by an etching process to expose the underlying conductive patterns 115-1 to 115-6 of the IC structure 112, to enable the conductive material filling in the through vias 540 to make physical and electrical contact with the conductive patterns 115-1 to 115-6 of the IC structure 112. In one or more embodiments, the etching process for removing the dielectric layer 149 at the bottoms of the through vias 540 comprises a sputter etching process for better adhesion and/or electrical contact. In at least one embodiment, the sputter etching process comprises PC-II, which is a sputter etching process normally with Ar+ plasma. A layer of the conductive material over the dielectric layer 149 is patterned to form routing 570 which includes one or more contact pads and/or one or more connectors, as described with respect to FIGS. 1, 3A-3F. Example conductive materials of the routing 570, contact structures 134, 136, and conductive through vias 141-148 include, but are not limited to, Ti, TiN, AlCu, Ag, Au or the like. In some embodiments, different conductive materials are deposited in various deposition processes to form various conductive features. For example, in one or more embodiments, different metals are deposited to form contact structures 134, 136, so that the different metals of the contact structures 134, 136 form corresponding ohmic contact and Schottky contact with the underlying doped regions 158, 166. A resulting structure 500L is obtained.

In FIG. 5M, various trenches 527, 528 are etched in the structure 500L to extend through the dielectric layer 149, dielectric layer 126, and semiconductor layer 122. In the example configuration in FIG. 5M, the cavities 527, 528 extend partially into the dielectric layer 124. The trench 527 is for formation of a sealing trench 127. The trenches 528 are for formation of isolation trenches 128-1 to 128-5, as described with respect to FIG. 1. A resulting structure 500M is obtained.

In FIG. 5N, a passivation layer 129 is deposited over the structure 500M. A dielectric material of the passivation layer 129 lines the sidewalls and bottoms of the trenches 527, 528. In the example configuration in FIG. 5N, the dielectric material of the passivation layer 129 fills in the trenches 528, and leaves the trench 527 partially unfilled. Other configurations are within the scopes of various embodiments. As a result of the deposition of the passivation layer 129, the trench 527 becomes a sealing trench 127 aligned with a sealing ring 117 of the IC structure 112, and the trenches 528 become isolation trenches 128-1 to 128-5 for isolating adjacent circuit elements of the second substrate 120 from each other. The passivation layer 129 over the routing 570 is patterned to expose contact pads 131, 132. Example materials of the passivation layer 129 include, but are not limited to, an oxide (e.g., SiO$_2$), a nitride (e.g., SiN), SiON, other dielectric materials, or a combination thereof. The semiconductor device 500 is obtained. In some embodiments, the described deposition and patterning of routing 570 and passivation layer 129 are repeated to form further routings and passivation layers, e.g., a further redistribution structure, over the second substrate 120. In at least one embodiment, one or more advantages described herein are achievable by the semiconductor device 500.

In at least one embodiment, one or more of the manufacturing processes described with respect to FIGS. 5D-5N, such as the fusion bonding, the etching of the through vias 540, the deposition of the dielectric layer 149, or the like, are processes usable in MEMS fabrication. As a result, it is possible to utilize MEMS processes, which are generally used for MEMS sensor/actuator technology, to provide passive circuits for IC structures, such as CMOS substrates.

In some embodiments, because passive circuits in the second substrate 120 are provided on top the first substrate 110, which is, e.g., a CMOS substrate and/or a HPC chip, it is possible to form short routing paths between the substrates for noise coupling, at no or low package cost.

In some embodiments, circuit elements of passive circuits, such as Schottky diodes, capacitors, and/or resistors, are formed in the second substrate 120 at a low process temperature, e.g., at 400° C. or lower. Therefore, it is possible, in one or more embodiments, to lower impacts of the passive circuit manufacturing processes on CMOS devices and/or active circuits of the first substrate 110.

In one or more embodiments, the bonding process of the first substrate 110 and second substrate 120 is a low temperature, zero stress fusion bonding process. Therefore, it is possible, in one or more embodiments, to lower impacts of the bonding process on CMOS devices and/or active circuits of the first substrate 110.

In some situations, because the manufacturing processes of CMOS devices on the first substrate 110 require a high process temperature, metal is not included in the FEOL processing to prevent metal contamination. Accordingly, it is difficult to form Schottky diodes on the first substrate 110, because the basic structure of a Schottky diode is the junction of a semiconductor with a metal. In at least one embodiment, by forming Schottky diodes on the second substrate 120, it is possible to select an appropriate metal for Schottky contacts, without risks of metal contamination. In at least one embodiment, it is further possible to provide various passive circuits containing Schottky diodes on the second substrate 120 to enhance performance and/or reliability of the CMOS substrate.

In some embodiments, capacitors formed on the second substrate 120 have high breakdown voltage and/or high capacitance at levels not achievable in other approaches, such as MIM or MOM capacitors formed on a CMOS substrate. A reason is that MIM or MOM capacitors formed on a CMOS substrate include dielectric materials with low dielectric constants; therefore, the breakdown voltage of such MIM or MOM capacitors is also low. On the contrary, it is possible to form capacitors on the second substrate 120, in accordance with some embodiments, to include dielectric materials with higher dielectric constants, with associated higher breakdown voltages. In some embodiments, it is possible to form comb-type capacitors in the second substrate due to higher hardness.

In some embodiments, it is possible to form in the semiconductor layer 122, e.g., a Si layer, of the second substrate 120, various types of capacitors, such as comb-type capacitors, flat-type capacitors, and 3D MIM or MOM capacitors. In at least one embodiment, the possibility to form various types of capacitors on the second substrate 120 provides customizability and/or flexibility to the semiconductor device design and/or manufacturing process.

In some embodiments, one or more capacitors, Schottky diodes and/or resistors in the second substrate are to form a variety of passive circuits which are electrically coupled to the first, CMOS substrate by one or more conductive through vias extending through the second substrate, to improve performance and/or reliability of the CMOS substrate. Examples of passive circuits include, but are not limited to, electrostatic discharge (ESD) circuits, DC power buffers, charge pumps, voltage clamps, pre-signal filter, rectifiers, or the like. In at least one embodiment, an ESD device included in the second substrate helps to prevent charging induce damage in Chip-on-Wafer-on-Substrate (CoWoS) or integrated fan-out (INFO) backend processes. In at least one embodiment, a high voltage charging pump included in the second substrate helps to effectively design high voltage driving circuits.

Figure 6:
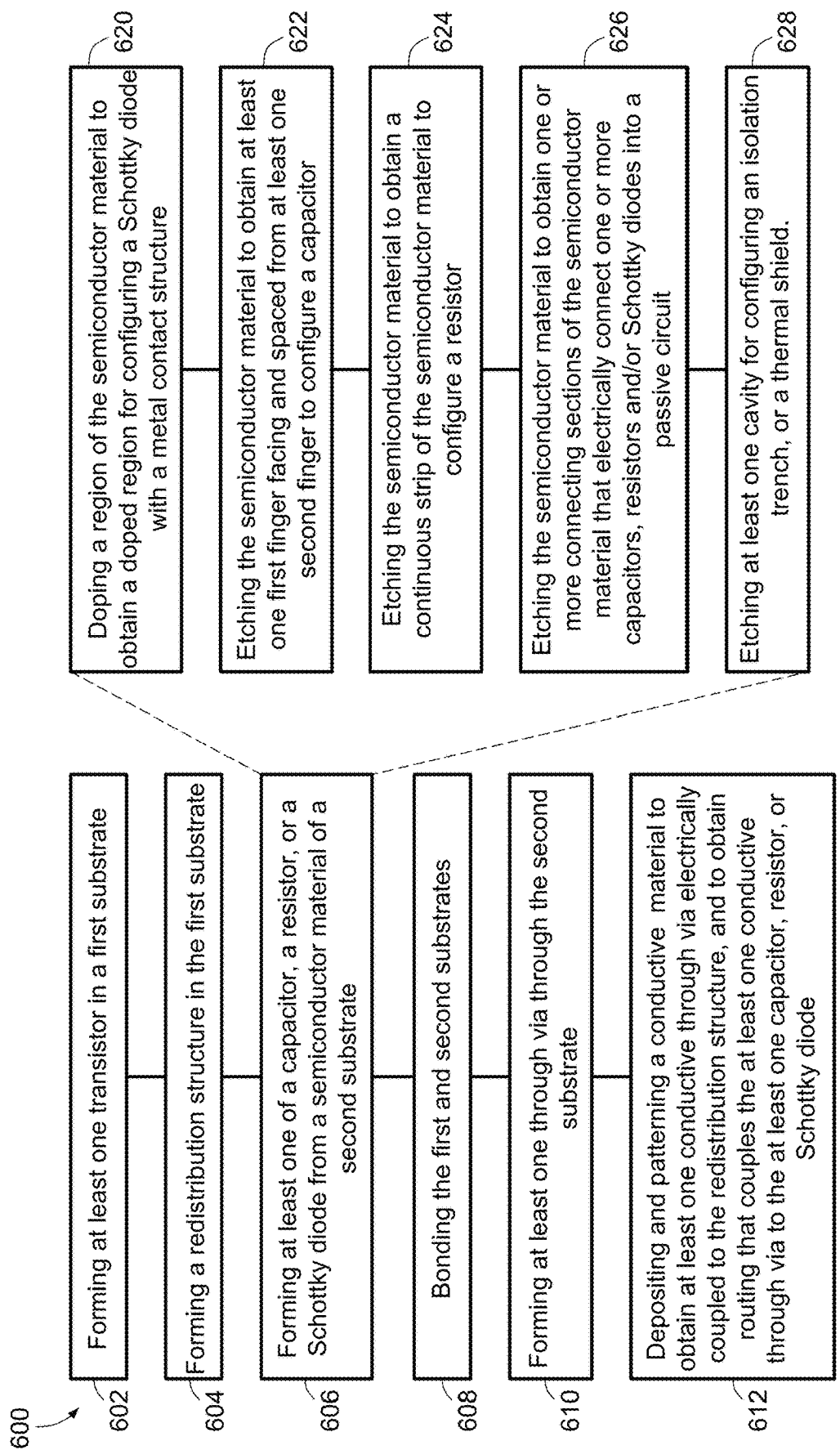
FIG. 6 is a flow chart of a semiconductor device manufacturing method, in accordance with some embodiments.

FIG. 6 is a flowchart of a method 600 of manufacturing a semiconductor device, in accordance with some embodiments.

At operation 602, at least one transistor is formed in a first substrate, for example, to form an active circuit, as described with respect to FIGS. 2 and 5A. In some embodiments, operation 602 is omitted, e.g., where the first substrate is an interposer.

At operation 604, a redistribution structure is formed in the first substrate. For example, various etching, depositing, and patterning processes are repeatedly performed to sequentially stack and connect metal layers and via layers into a redistribution structure, as described with respect to FIGS. 2, 5A. In some embodiments, when the first substrate comprises active circuits, the redistribution structure is electrically coupled to the active circuits. In some embodiments, at least one conductive pattern in a top metal layer of the redistribution structure is configured as a shield for a later formed capacitor, as described with respect to FIG. 1.

At operation 606, at least one of a capacitor, a resistor, or a Schottky diode is formed, at least partially, from a semiconductor material of a second substrate. Operation 606 comprises one or more of operations 620, 622, 624, 626, 628 described herein.

At operation 608, the first substrate and the second substrate are bonded together, for example, by a fusion bonding, as described with respect to FIGS. 1, 5H.

At operation 610, at least one through via is formed through the second substrate, for example, as described with respect to FIG. 5J.

At operation 612, a conductive material is deposited and patterned to obtain at least one conductive through via electrically coupled to the redistribution structure, and to obtain routing that couples the at least one conductive through via to the at least one capacitor, resistor, or Schottky diode. For example, a conductive material is deposited and patterned to obtain various conductive through vias 141-148, and to obtain routing 570, as described with respect to FIGS. 1, 5L.

As described herein, operation 606 comprises one or more of operations 620, 622, 624, 626, 628.

At operation 620, a region of the semiconductor material is doped to obtain a doped region for configuring a Schottky diode with a metal contact structure. For example, a doped region 166 is formed in the semiconductor material of the second substrate 120, to later configure a Schottky diode with a contact structure 136, as described with respect to FIGS. 1, 3E-3F, 5D. In some embodiments, operation 620 is omitted, e.g., where it is possible for the contact structure 136 to form a Schottky contact with the semiconductor material of the second substrate 120.

At operation 622, the semiconductor material is etched to obtain at least one first finger facing and spaced from at least one second finger to configure a capacitor, for example, as described with respect to FIGS. 1, 3A-3C, 5E.

At operation 624, the semiconductor material is etched to obtain a continuous strip of the semiconductor material that configures a resistor, for example, as described with respect to FIGS. 1, 3D, 5E.

At operation 626, the semiconductor material is etched to obtain one or more connecting sections of the semiconductor material that electrically connect one or more capacitors, resistors and/or Schottky diodes into a passive circuit. For example, the semiconductor material is etched to form sections 401, 402, 403 that electrically connect a capacitor, a resistor and a Schottky diode into an ESD circuit, as described with respect to FIGS. 4A-4B. For another example, the semiconductor material is etched to form sections 459 that electrically connect various capacitors and Schottky diodes into a charge pump, as described with respect to FIGS. 4C-4D.

At operation 628, at least one cavity is etched for configuring an isolation trench, or a thermal shield. For example, a cavity 564 is etched in the semiconductor material to later configure an isolation trench 164, as described with respect to FIGS. 1, 5E. For another example, a cavity 169 is etched in at least the dielectric layer 124 to later configure a buried cavity configured to shield or dissipate heat for a Schottky diode, as described with respect to FIGS. 1, 5G. In some embodiments, the etching of at least one of the cavity 564 or the cavity 169 is omitted.

The described methods include example operations, but they are not necessarily required to be performed in the order shown. Operations may be added, replaced, changed order, and/or eliminated as appropriate, in accordance with the spirit and scope of embodiments of the disclosure. Embodiments that combine different features and/or different embodiments are within the scope of the disclosure and will be apparent to those of ordinary skill in the art after reviewing this disclosure.

Figure 7:
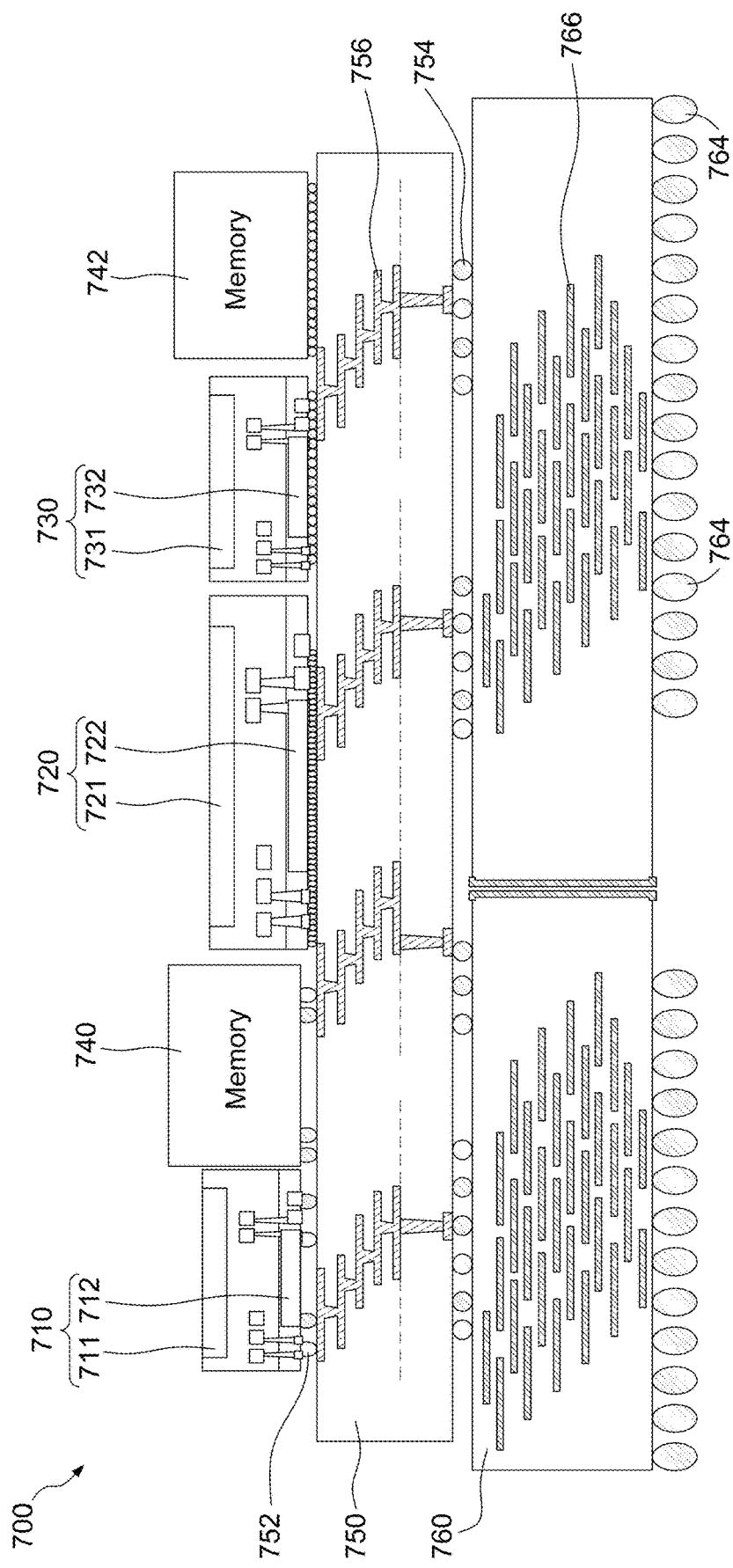
FIG. 7 is a schematic cross-section view of a 3D IC device, in accordance with some embodiments.

FIG. 7 is a schematic cross-section view of a 3D IC device 700, in accordance with some embodiments. The 3D IC device 700 comprises semiconductor devices 710, 720, 730, memory chips 740, 742, an interposer 750, and a package substrate 760.

In some embodiments, at least one of the semiconductor devices 710, 720, 730 corresponds to the semiconductor device 100 and/or a semiconductor device manufactured by one or more processes described with respect to FIGS. 5A-5N, 6. For example, the semiconductor device 710 comprises a first CMOS substrate 711 bonded to a second substrate 712 which includes one or more passive circuits electrically coupled to the CMOS substrate 711, the semiconductor device 720 comprises a first CMOS substrate 721 bonded to a second substrate 722 which includes one or more passive circuits electrically coupled to the CMOS substrate 721, and the semiconductor device 730 comprises a first CMOS substrate 731 bonded to a second substrate 732 which includes one or more passive circuits electrically coupled to the CMOS substrate 731. One or more of the second substrates 712, 722, 732 correspond to the second substrate 120. In some embodiments, the semiconductor device 710, 720, 730 with passive circuits on second substrates 712, 722, 732 on top of the corresponding CMOS substrates 711, 721, 731 make it possible to simply reduce die stacking and/or enhance circuit function.

In at least one embodiment, the CMOS substrate 711 comprises an input/output (I/O) chip, and the second substrate 712 comprises one or more passive circuits coupled to and configured to enhance performance and/or reliability of the I/O chip 711. Examples of passive circuits on the second substrate 712 include, but are not limited to, DC power buffers, pre-signal filters, voltage clamping circuits, ESD circuits, or the like.

In at least one embodiment, the second substrate 722 comprises one or more passive circuits coupled to and configured to enhance digital performance and/or reliability of the CMOS substrate 721. Examples of passive circuits on the second substrate 722 include, but are not limited to, DC power buffers, rectifiers, pre-signal filters, ESD circuits, or the like.

In at least one embodiment, the second substrate 732 comprises one or more passive circuits coupled to and configured to enhance analog performance and/or reliability of the CMOS substrate 731. Examples of passive circuits on the second substrate 732 include, but are not limited to, charge pumps with high capacitance, DC power buffers, rectifiers, pre-signal filters, or the like.

The semiconductor devices 710, 720, 730, and memory chips 740, 742 are bonded to the interposer 750 by solder bumps schematically designated at 752. The interposer 750 is bonded to the package substrate 760, by solder bumps schematically designated at 754. Other bonding methods such as hybrid bonding, Chip-on-Wafer (CoW) bonding, or the like are within the scopes of various embodiments. The interposer 750 comprises a redistribution structure 756 electrically coupling one or more of the semiconductor devices 710, 720, 730, and memory chips 740, 742 together and/or to the solder bumps 754. The package substrate 760 comprises solder bumps 764, and a redistribution structure 766 electrically coupling solder bumps 754 to solder bumps 764. In at least one embodiment, one or more advantages described herein are achievable by the 3D IC device 700.

In some embodiments, a semiconductor device comprises a first substrate having opposite first and second sides, a first conductive layer on the first side of the first substrate, and a second substrate having opposite first and second sides. The second side of the second substrate is bonded to the first side of the first substrate. The second substrate comprises a semiconductor material, and at least one circuit element electrically coupled to the first conductive layer. The at least one circuit element comprises at least one of a Schottky diode configured by the semiconductor material and a first contact structure, a capacitor having a first electrode of the semiconductor material, or a resistor of the semiconductor material.

In a method of manufacturing a semiconductor device in accordance with some embodiments, at least one transistor is formed over a first substrate, and a redistribution structure is formed over the first substrate. The redistribution structure is electrically coupled to the at least one transistor. A semiconductor material of a second substrate is etched to form a plurality of first fingers of the semiconductor material and a plurality of second fingers of the semiconductor material. The plurality of first fingers and the plurality of second fingers are interdigitated with each other to configure a capacitor having a comb structure. The first substrate is bonded to the second substrate. At least one through via is etched to extend through the second substrate and partially expose the redistribution structure. At least one conductive material is deposited in the through via to form a conductive through via electrically coupled to the redistribution structure, and over the second substrate to form a first contact structure electrically coupling the conductive through via to the plurality of first fingers of the capacitor.

In some embodiments, a semiconductor device comprises a substrate comprising a semiconductor material, and a passive circuit comprising at least a first circuit element and a second circuit element which are electrically coupled to each other by a section of the semiconductor material. The first circuit element is one of a Schottky diode, a capacitor, and a resistor. The second circuit element is a different one of the Schottky diode, the capacitor, and the resistor. The Schottky diode comprises a contact structure and a doped region of the semiconductor material, the doped region in Schottky contact with and extending around the contact structure. The capacitor comprises a plurality of interdigitated fingers of the semiconductor material, the plurality of interdigitated fingers configuring electrodes of the capacitor. The resistor comprises a strip of the semiconductor material, the strip having a meandering shape.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
a first substrate having opposite first and second sides,
a first conductive layer on the first side of the first substrate; and
a second substrate having opposite first and second sides, the second side of the second substrate bonded to the first side of the first substrate,
wherein
the second substrate comprises:
a semiconductor material, and
at least one circuit element electrically coupled to the first conductive layer, the at least one circuit element comprises:
a Schottky diode configured by the semiconductor material and a first contact structure,
the semiconductor material comprises a first doped region on the first side of the second substrate,
the first doped region forms a Schottky contact with the first contact structure to configure the Schottky diode,
the semiconductor device further comprises a second contact structure,
the semiconductor material further comprises a second doped region on the first side of the second substrate, and
the second doped region forms an ohmic contact with the second contact structure.

2. The semiconductor device of claim 1, further comprising:
a second conductive layer over the first side of the second substrate, and electrically coupled to the at least one circuit element; and
at least one conductive through via extending from the first side of the second substrate to the second side of the second substrate, and electrically coupling the second conductive layer to the first conductive layer.

3. The semiconductor device of claim 1, wherein
the semiconductor material comprises:
a first portion including both the first and second doped regions, and
a second portion electrically isolated from the first portion, and
the semiconductor device further comprises a connector electrically coupled to the first contact structure, and extending from the first portion to the second portion.

4. The semiconductor device of claim 3, further comprising:
at least one conductive through via extending from the first side of the second substrate to the second side of the second substrate, and electrically coupling at least one of the first contact structure or the second contact structure to the first conductive layer.

5. The semiconductor device of claim 1, wherein
the second substrate further comprises a buried cavity overlapping at least partially the first doped region along a thickness direction between the first side of the second substrate and the second side of the second substrate.

6. The semiconductor device of claim 1, wherein
the at least one circuit element further comprises a capacitor,
the capacitor comprises a plurality of fingers of the semiconductor material,
the plurality of fingers comprises first fingers configuring a first electrode of the capacitor, and second fingers configuring a second electrode of the capacitor, and
the first fingers and the second fingers are interdigitated with each other.

7. The semiconductor device of claim 1, wherein
the at least one circuit element further comprises a capacitor, the second substrate further comprises a dielectric layer between the semiconductor material and the first conductive layer, and the capacitor comprises
- a first electrode comprising a portion of the semiconductor material,
- a second electrode comprising a conductive pattern in the first conductive layer, and
- a portion of the dielectric layer between the first electrode and the second electrode.

8. The semiconductor device of claim 1, wherein the at least one circuit element further comprises a resistor, and the resistor comprises a strip of the semiconductor material.

9. A semiconductor device, comprising:

a substrate;

at least one transistor over the substrate;

a redistribution structure over and electrically coupled to the at least one transistor;

a semiconductor material over the redistribution structure, and comprising a plurality of first fingers and a plurality of second fingers,
- wherein the plurality of first fingers and the plurality of second fingers are interdigitated with each other to configure a capacitor having a comb structure;

a conductive through via extending through the semiconductor material and electrically coupled to the redistribution structure;

a first contact structure over the semiconductor material and electrically coupling the conductive through via to the plurality of first fingers of the capacitor; and a doped region in a portion of the semiconductor material, said portion continuous to the plurality of first fingers, wherein the first contact structure is in ohmic contact with the doped region.

10. The semiconductor device of claim 9, wherein the plurality of first fingers and the plurality of second fingers are interdigitated with each other in a plan view along a thickness direction of the substrate.

11. The semiconductor device of claim 9, further comprising:

one or more trenches in the semiconductor material; and a first electrode, a dielectric material, and a second electrode over sidewalls and bottoms of the one or more trenches, wherein the first electrode, the dielectric material and the second electrode configure a further capacitor which is a three-dimensional (3) Metal-Insulator-Metal (MIM) or Metal-Oxide-Metal (MOM) capacitor.

12. The semiconductor device of claim 9, wherein the plurality of first fingers and the plurality of second fingers overlap, along a thickness direction of the substrate, at least partially a conductive pattern in a top metal layer of the redistribution structure, said conductive pattern configuring a shielding for the capacitor.

13. The semiconductor device of claim 9, further comprising:

a dielectric material surrounding the plurality of first fingers and the plurality of second fingers, and filled in a space between the plurality of first fingers and the plurality of second fingers.

14. The semiconductor device of claim 9, further comprising:

a first doped region in a first portion of the semiconductor material;

a trench isolating the first portion of the semiconductor material from an adjacent, second portion of the semiconductor material; and a second contact structure in Schottky contact with the first doped region to configure a Schottky diode.

15. The semiconductor device of claim 14, further comprising:

a dielectric material surrounding the plurality of first fingers and the plurality of second fingers, and filled in the trench and a space between the plurality of first fingers and the plurality of second fingers; and a cavity in the dielectric material, said cavity overlapping the first doped region along a thickness direction of the substrate, wherein the cavity is a buried cavity configured to thermally shield the Schottky diode.

16. The semiconductor device of claim 14, further comprising:

in the first portion of the semiconductor material, a second doped region spaced from the first doped region; and a third contact structure in ohmic contact with the second doped region.

17. A semiconductor device, comprising:

a substrate comprising a semiconductor material; and a passive circuit comprising at least a first circuit element and a second circuit element which are electrically coupled to each other by a section of the semiconductor material, wherein the first circuit element is one of a Schottky diode, a capacitor, and a resistor, the second circuit element is a different one of the Schottky diode, the capacitor, and the resistor, the Schottky diode comprises a contact structure and a doped region of the semiconductor material, the doped region in Schottky contact with and extending around the contact structure, the capacitor comprises a plurality of interdigitated fingers of the semiconductor material, the plurality of interdigitated fingers configuring electrodes of the capacitor, and the resistor comprises a strip of the semiconductor material, the strip having a meandering shape.

18. The semiconductor device of claim 17, wherein the passive circuit comprises at least one of:
- a DC power buffer,
- a pre-signal filter,
- a voltage clamping circuit,
- an electrostatic discharge (ESD) circuit,
- a rectifier, or
- a charge pump.

19. The semiconductor device of claim 10, further comprising:

a further doped region in a further portion of the semiconductor material, said further portion continuous to the plurality of second fingers;

a second contact structure in ohmic contact with the further doped region; and a further conductive through via extending through the semiconductor material and electrically coupling the second contact structure to the redistribution structure.

20. The semiconductor device of claim 9, further comprising:

a resistor comprising a meandering strip of the semiconductor material.

* * * * *